(12) United States Patent
Lim et al.

(10) Patent No.: US 12,223,181 B2
(45) Date of Patent: Feb. 11, 2025

(54) STORAGE DEVICE AND ELECTRONIC DEVICE INCLUDING THE SAME

(71) Applicant: SAMSUNG ELECTRONICS CO., LTD., Suwon-si (KR)

(72) Inventors: Jaehwan Lim, Suwon-si (KR); Yeongyu Ahn, Suwon-si (KR); Hyunjung Yoo, Suwon-si (KR); Jungwoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/197,456

(22) Filed: May 15, 2023

(65) Prior Publication Data

US 2024/0086078 A1 Mar. 14, 2024

(30) Foreign Application Priority Data

Sep. 14, 2022 (KR) .................. 10-2022-0115394

(51) Int. Cl.
*G06F 12/00* (2006.01)
*G06F 3/06* (2006.01)

(52) U.S. Cl.
CPC .......... *G06F 3/0619* (2013.01); *G06F 3/0629* (2013.01); *G06F 3/0653* (2013.01); *G06F 3/0679* (2013.01)

(58) Field of Classification Search
CPC .... G06F 3/0619; G06F 3/0629; G06F 3/0653; G06F 3/0679; G06F 3/0683; G06F 12/0238
See application file for complete search history.

(56) References Cited

U.S. PATENT DOCUMENTS

| | | |
|---|---|---|
| 9,043,539 B2 | 5/2015 | Kaiwa et al. |
| 9,658,795 B2 | 5/2017 | Jayaraman et al. |
| 10,019,188 B2 | 7/2018 | Chung et al. |
| 10,062,453 B1 | 8/2018 | Griffin |
| 10,120,593 B2 | 11/2018 | Byun et al. |
| 10,324,642 B2 | 6/2019 | Sweere et al. |
| 11,355,165 B2 | 6/2022 | Porter et al. |
| 2014/0185384 A1* | 7/2014 | Kim ............ G11C 16/20 365/198 |

* cited by examiner

*Primary Examiner* — Shawn X Gu
(74) *Attorney, Agent, or Firm* — Sughrue Mion, PLLC

(57) ABSTRACT

A storage device includes at least one nonvolatile memory device and a storage controller. The storage controller controls the at least one nonvolatile memory device based on a request from an external host. The storage controller adaptively adjusts an impedance of a transmission driver based on a change of an operating temperature of the storage device. The transmission driver transmits a transmission signal to the external host through a link. The storage device may increase an eye height of the transmission signal transmitted to the host through the link by decreasing impedance of the transmission driver as the operating temperature increases. Therefore, the storage device according to example embodiments may maintain reliability of the link even though the operating temperature of the storage device increases.

19 Claims, 24 Drawing Sheets

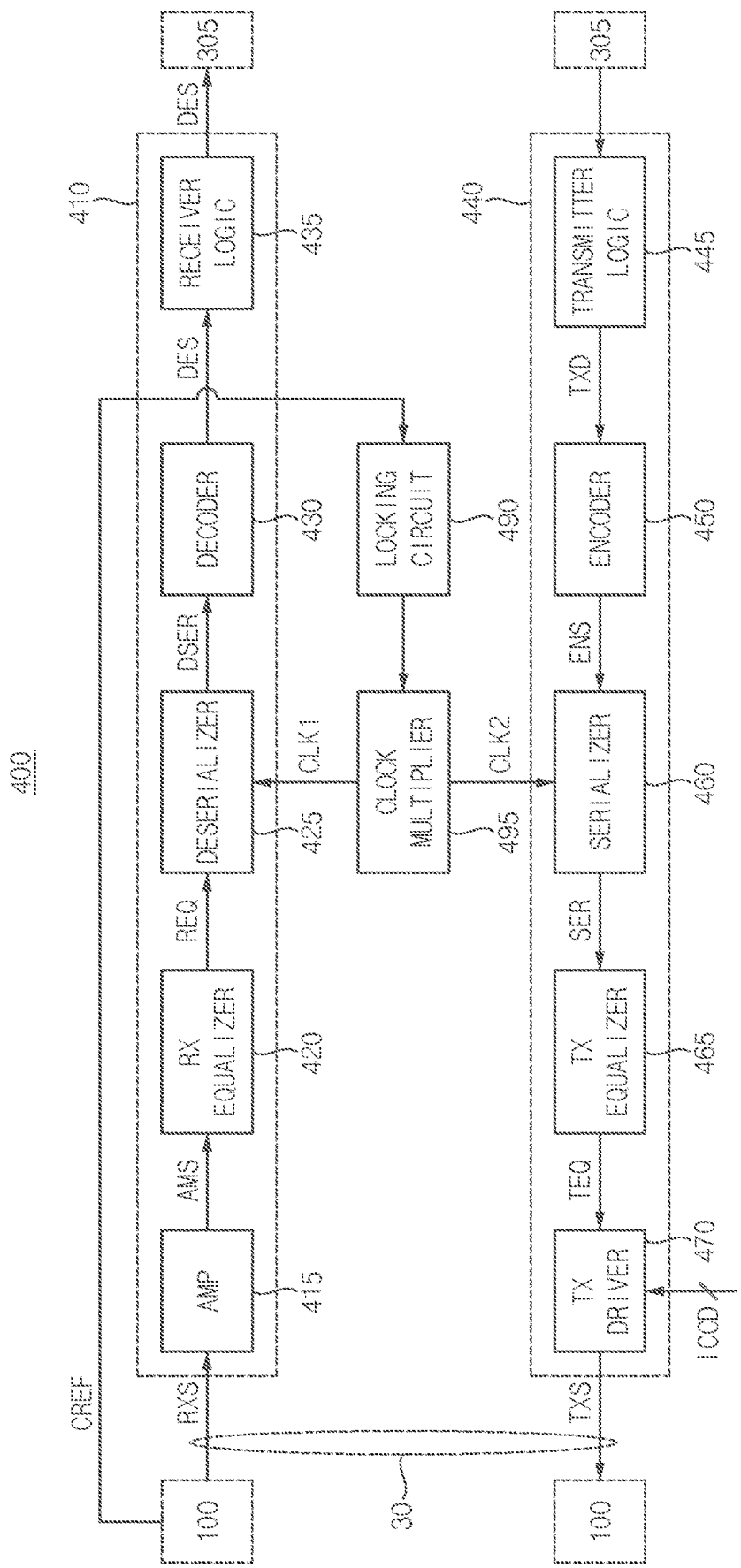

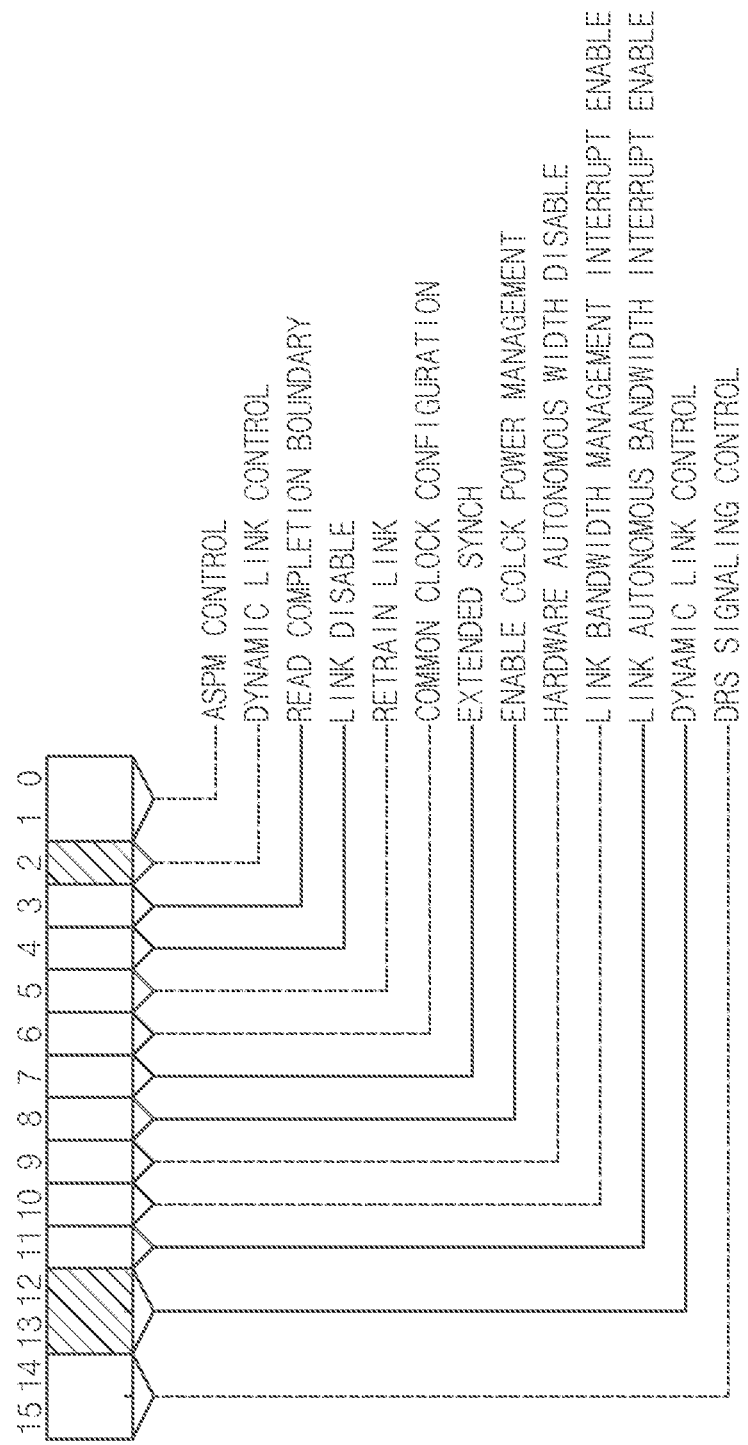

| IMPEDANCE | EYE HEIGHT |
|---|---|
| IMP11 | EH11 |
| IMP12 | EH12 |
| IMP13 | EH13 |

IMP11>IMP12>IMP13
EH11<EH12<EH13

| TEMPERATURE | ALRT | IMPEDANCE |
|---|---|---|
| TEMP1 ⋮ | ST1('00') | IMP21 |
| TEMP2 ⋮ | ST2('01') | IMP22 |
| TEMP3 ⋮ | ST3('11') | IMP23 |

IB

INCREASE → TEMP1
TV1 → TEMP2
TV2 → TEMP3

IMP21>IMP22>IMP23

STORAGE DEVICE AND ELECTRONIC DEVICE INCLUDING THE SAME

CROSS-REFERENCE TO RELATED APPLICATIONS

This US application claims the benefit of priority under 35 USC § 119 to Korean Patent Application No. 10-2022-0115394, filed on Sep. 14, 2022 in the Korean Intellectual Property Office, the disclosures of which are incorporated by reference herein in their entirety.

BACKGROUND

1. Field

Example embodiments generally relate to semiconductor memory devices, and more particularly to storage devices and electronic devices including the same.

2. Discussion of Related Art

Flash memory devices are widely being used as audio and video data storage medium of information devices such as computers, smart phones, digital cameras, camcorders, voice recorders, MP3 players, handheld PCs, etc.

A typical example of a flash memory-based high capacity storage device includes a solid state drive (SSD). As the use of SSDs explosively increases, the use of the SSDs is variously divided. For example, the use of SSDs may be subdivided into SSDs for servers, SSDs for clients, SSDs for data centers, etc. An SSD interface should be able to provide an optimum speed and optimum reliability based on its use. There are Serial Advanced Technology Attachment (SATA), Serial Attached Small Computer System Interface (SAS), etc. as the optimum SSD interfaces that can satisfy that requirement. A SSD that applies a Peripheral Component Interconnect Express (PCIe)-based interface is currently being actively studied and applied.

A host device fitted with a SSD may include various computer systems. For example, a SSD may be connected to a server, a data center, or a personal computer (PC). A communication port of a host device and a SSD may be managed in various link states to reduce power consumption.

SUMMARY

Some example embodiments may provide a storage device capable of adjusting transmission impedance based on operating temperature.

Some example embodiments may provide an electronic device including storage devices capable of adjusting transmission impedance based on operating temperature.

Provided herein is a storage device including: at least one nonvolatile memory device; and a storage controller, comprising a transmission driver, configured to control the at least one nonvolatile memory device based on a request from an external host, wherein the storage controller is configured to adaptively adjust an impedance of the transmission driver based on a change of an operating temperature of the storage device, and wherein the transmission driver is configured to transmit a transmission signal to the external host through a link.

Also provided herein is an electronic device including: a power supply configured to supply a first power and a second power; a first solid state drive (SSD) backplane and a second SSD backplane configured to receive the first power from the power supply, the first SSD backplane including first plurality of SSDs and the second SSD backplane including a second plurality of SSDs; and a baseboard configured to receive the second power from the power supply, to independently power on and power off the first SSD backplane and the second SSD backplane, and to access the first plurality of SSDs of the first SSD backplane, wherein the first SSD backplane is in a power-on state, wherein each of the first plurality of SSDs and the second plurality of SSDs includes a temperature sensor configured to sense an operating temperature, wherein each SSD of the first plurality of SSDs and each SSD of the second plurality of SSDs is configured to individually adjust an impedance of a transmission driver based on the operating temperature, and wherein the transmission driver is configured to transmit a transmission signal to the baseboard through a link.

Also provided herein is a storage device including: at least one nonvolatile memory device; and a storage controller configured to control the at least one nonvolatile memory device based on a request from an external host, wherein the storage controller includes: a temperature sensor configured to sense an operating temperature of the storage device and generate an temperature signal corresponding to the operating temperature; a temperature monitor configured to monitor the operating temperature of the storage device based on the temperature signal and generate an alert signal in response to the operating temperature exceeding at least one threshold value; a transmission impedance controller configured to generate an impedance control code for adjusting an impedance based on the alert signal; and a transmission driver configured to decrease the impedance of the transmission driver in response to an increase of the operating temperature such that an eye height of a transmission signal is increased, and wherein the transmission driver is configured to transmit the transmission signal to the external host through a link.

Accordingly, the storage device according to example embodiments may increase an eye height of the transmission signal transmitted to the host through the link by decreasing impedance of the transmission driver as the operating temperature increases. Therefore, the storage device according to example embodiments may maintain reliability of the link even though the operating temperature of the storage device increases.

BRIEF DESCRIPTION OF DRAWINGS

Illustrative, non-limiting example embodiments will be more clearly understood from the following detailed description in conjunction with the accompanying drawings.

FIG. 5 is a block diagram illustrating an example of the host interface circuit in the storage controller of FIG. 3 according to example embodiments.

FIG. 7 illustrates an example of a register of the storage controller of FIG. 3.

DETAILED DESCRIPTION

Various example embodiments will be described more fully hereinafter with reference to the accompanying drawings, in which some example embodiments are shown.

In the following descriptions, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of this disclosure. It will be apparent, however, to one skilled in the art that these specific details need not be employed to practice the principles and solutions discussed in this disclosure.

Among various interconnect fabric architectures, example embodiments are described based on a Peripheral Component Interconnect (PCI) Express (PCIe) architecture. A primary goal of PCIe is to enable components and devices from different vendors to inter-operate in an open architecture, spanning multiple market segments; Clients (Desktops and Mobile), Servers (Standard and Enterprise), and Embedded and Communication devices. PCI Express is a high performance, general purpose I/O interconnect defined for a wide variety of future computing and communication platforms.

Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot-Swap support, Data Integrity, Error Handling and Credit-based Flow Control are among some of the advanced features supported by PCI Express.

Figure 1:
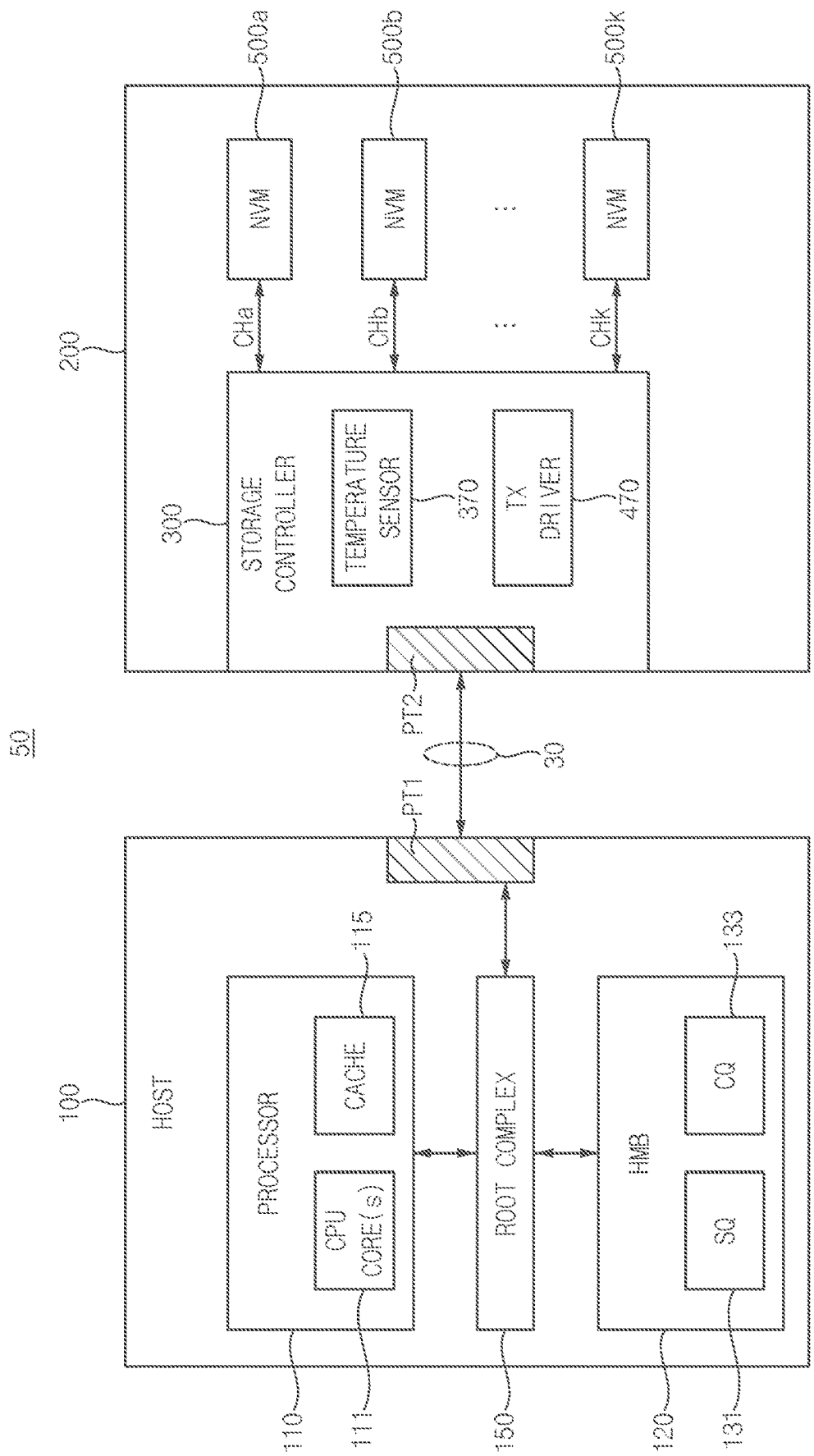
FIG. 1 is a block diagram illustrating a storage system according to example embodiments.

FIG. 1 is a block diagram illustrating a storage system according to example embodiments.

Referring to FIG. 1, a storage system 50 may include a host 100 and a storage device 200 connected to each other through a link 30. FIG. 1 illustrates only the elements for describing example embodiments, and each of the host 100 and the storage device 200 may further include various elements depending on its own functionality.

The host 100 may control overall operations of the storage system 50. For example, the host 100 may store data in the storage device 200 or may read data stored in the storage device 200. The host 100 may communicate with the storage device 200 through a first port PT1. In an embodiment, the first port PT1 may be a physical port that is based on a PCIe protocol. However, the present disclosure is not limited thereto.

The host 100 may include a processor 110, a host memory buffer (HMB) 120 and a root complex 150.

The processor 110 may be referred to as a host processor and may include a CPU core(s) 111 and a cache dedicated to the CPU core 111.

The HMB 120 may include a submission queue SQ 131 and a completion queue CQ 133. The submission queue 131 may be storage such as dedicated storage that stores a command to be provided to the storage device 200. The completion queue 133 may be storage such as dedicated storage that stores completion information about an operation completed in the storage device 200 based on the command. The command stored in the submission queue 131 may be defined by an NVMe specification.

The root complex 150 may be connected to the processor 110 and the HMB 120.

The storage device 200 may include a storage controller 300 and a plurality of nonvolatile memory devices NVM 500a, 500b, . . . , 500k. Each of the plurality of nonvolatile memory devices 500a, 500b, . . . , 500k may be connected to the storage controller 300 through a respective one of a plurality of channels CHa, CHb, . . . , CHk. Here, k is an integer greater than two.

Each of the plurality of nonvolatile memory devices 500a, 500b, . . . , 500k may operate under control of the storage controller 300. Each of the plurality of nonvolatile memory devices 500a, 500b, . . . , 500k may be a NAND flash memory device, however, the present disclosure is not limited thereto.

The storage controller 300 may include a temperature sensor 370 and a transmission (TX) driver 470.

The temperature sensor 370 may sense an operating temperature of the storage device 200 and may generate temperature signal (temperature information) based on the sensed operating temperature.

The transmission driver 470 may adjust an eye height of a transmission signal transmitted to the host 100 by adjusting a transmission impedance (impedance) based on the temperature signal. The transmission driver 470 may increase the eye height of the transmission signal transmitted to the host 100 in response to an increase of the operating temperature, thereby to enhance reliability of the link 30. Therefore, the storage controller 200 may adaptively adjust the impedance of the transmission driver 470 that transmits the transmission signal to the host 100 through the link 30 based on a change of an operating temperature of the storage device 200. The storage controller 200 may decrease the impedance of the transmission driver 470 in response to an increase of the operating temperature such that the eye height of the transmission signal is increased.

In example embodiment, the link 30 may be according to PCIe standards.

Hereinafter, example embodiments are described based on relationship between one host and one storage device and it will be understood that example embodiment may be applied to multiple transceiver devices performing a bi-directional communication as illustrated in FIG. 1.

Figure 2:
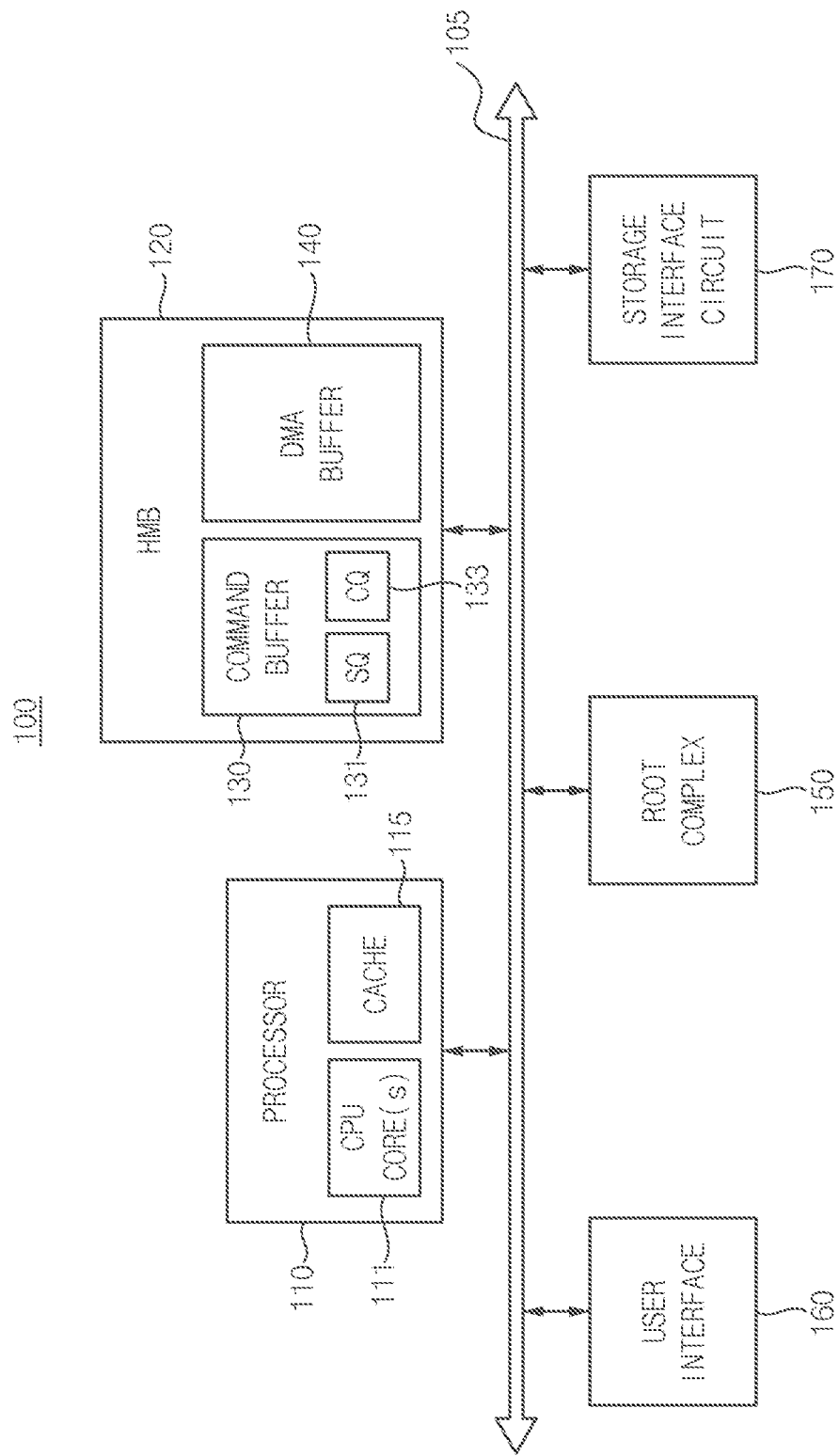
FIG. 2 is a block diagram illustrating an example of the host in the storage system of FIG. 1 according to example embodiments.

FIG. 2 is a block diagram illustrating an example of the host in the storage system of FIG. 1 according to example embodiments.

Referring to FIG. 2, the host 100 may include a processor 110, a HMB 120, a root complex 150, a user interface 160 and a storage interface circuit 170 connected to each other through a bus 105.

The bus 105 may refer to a transmission channel via which data is transmitted between the processor 110, the HMB 120, the root complex 150, the user interface 160 and the storage interface 170 of the host 100.

The processor 100 may include a CPU core 11 and a cache 115. The processor 110 may output a command may receive a completion information associated with completion of processing of the command.

The HMB 120 may include a command buffer 130 and a DMA buffer 140. The command buffer 130 may include the submission queue 131 and the completion queue 133. The DMA buffer 140 may include data that is processed based on a DMA transmission. The DMA transmission may be associated with transmitting data based on the DMA without intervention of the CPU core 111.

The user interface 160 may be a physical or virtual medium for exchanging information between a user and the host 100, a computer program, etc., and includes physical hardware and logical software. The storage interface circuit 170 may be configured to communicate with the storage device 200. The storage interface circuit 170 may include a transmitter and a receiver.

Figure 3:
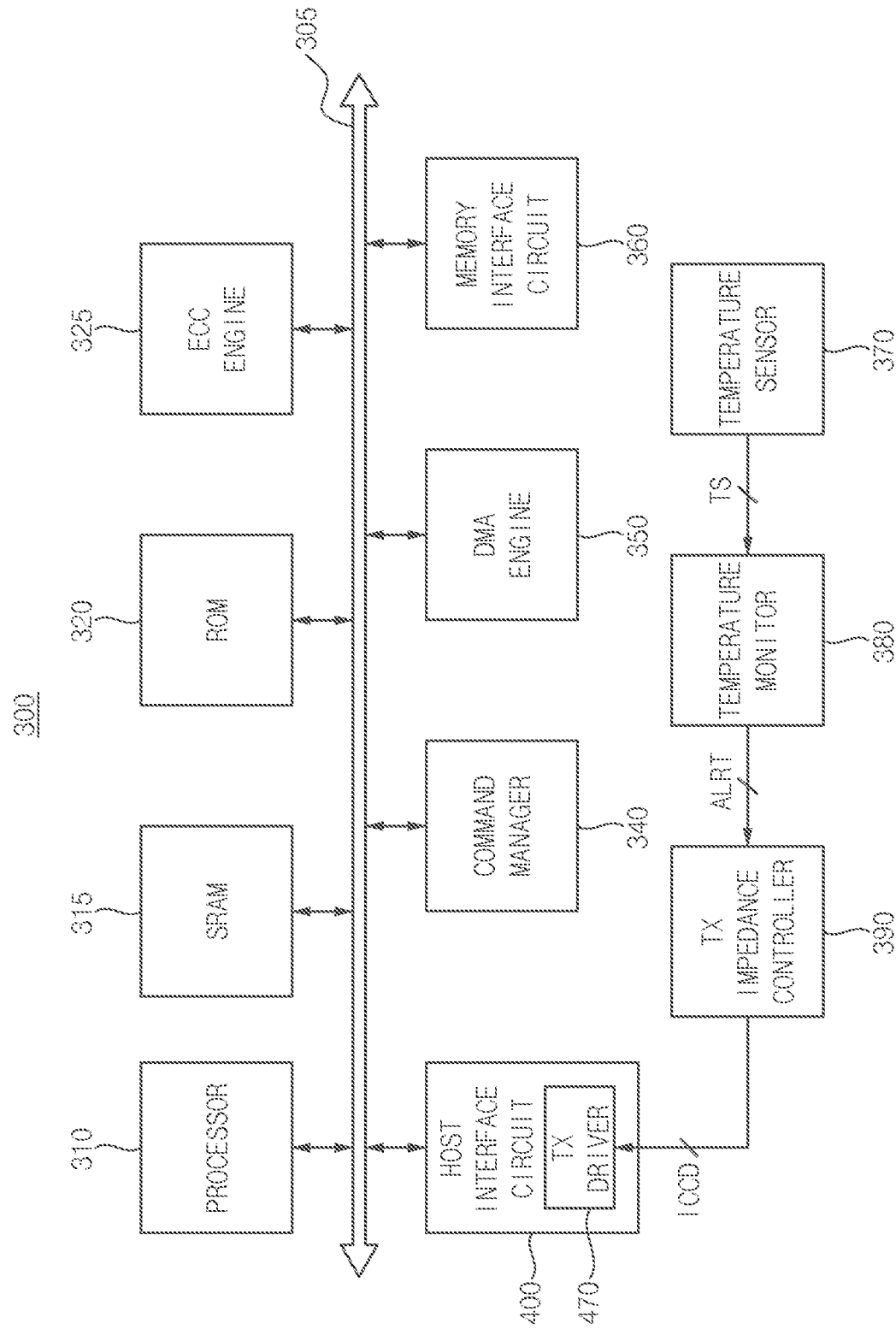
FIG. 3 is a block diagram illustrating an example of the storage controller in the storage system of FIG. 1 according to example embodiments.

FIG. 3 is a block diagram illustrating an example of the storage controller in the storage system of FIG. 1 according to example embodiments.

Referring to FIG. 3, the storage controller 300 may include a processor 310, an SRAM 315, a ROM 320, an error correction code (ECC) engine 325, a host interface circuit 400, a command manager 340, a DMA engine 350, a memory interface circuit 360 which are connected via a bus 305. The storage controller 300 may further include the temperature sensor 370, a temperature monitor 380 and a transmission (TX) impedance controller 390.

The processor 310 controls an overall operation of the storage controller 300. The SRAM 315 may store various application programs that are executable by the processor 310. The SRAM 315 may operate as a buffer memory, a cache memory or a working memory of the processor 310. The ECC engine 325 may detect and/or correct errors which occur in the data read from the plurality of nonvolatile memory devices 500a, 500b, . . . , 500k.

The command manager 340 may manage the command received from the host 100. The DMA engine 350 may control a DMA operation on the command output from the host 100.

In example embodiments, the command manager 340 and the DMA engine 350 may be implemented in the form of software, hardware, or a combination thereof. The ROM 320 may store operating method of the command manager 340 and operating method of the DMA engine 350. The processor 310 may control the command manager 340 and the DMA engine 350.

The storage controller 300 may communicate with the host 100 through the host interface circuit 400. For example, the host interface circuit 400 may be configured to communicate with the host 100 according to the DMA transmission. The host interface circuit 400 may include a transmission (TX) driver 470.

The storage controller 300 may communicate with the plurality of nonvolatile memory devices 500a, 500b, . . . , 500k through the memory interface circuit 360. For example, the memory interface circuit 360 may be configured to communicate with the plurality of nonvolatile memory devices 500a, 500b, . . . , 500k according to the DMA transmission.

The temperature sensor 370 may sense an operating temperature of the storage device 200 and may generate a temperature signal TS corresponding to the sensed operating temperature. The temperature monitor 380 may monitor the operating temperature of the storage device 200 based on the temperature signal TS and may generate an alert signal ALRT in response to the operation temperature exceeding at least one threshold value. The alert signal ALRT may include a plurality of bits.

The transmission impedance controller 390 may generate an impedance control code ICCD for adjusting the impedance of the transmission driver 470 based on the alert signal ALRT. The transmission driver 470 may adjust the impedance in response to the impedance control code ICCD to adjust an eye height of the transmission signal.

The temperature monitor 380 may compare the operating temperature with the at least one threshold value based on the temperature signal TS and may change of a state of the plurality of bits of the alert signal ALRT based on a result of the comparison. For example, the temperature monitor 380 may set the plurality of bits of the alert signal ALRT to have a first state in response to the operating temperature being equal to or smaller than a first threshold value of the at least one threshold value, may set the plurality of bits of the alert signal ALRT to have a second state different from the first state in response to the operating temperature exceeding the first threshold value, and may set the plurality of bits of the alert signal ALRT to have a third state different from the second state and the first state in response to the operating temperature exceeding a second threshold value greater than the first threshold value of the at least one threshold value.

The transmission impedance controller 470 may generate the impedance control code ICCD to have a first impedance value in response to the alert signal ALRT having the first state, may generate the impedance control code ICCD to have a second impedance value smaller than the first impedance value in response to the alert signal ALRT having the second state, and may generate the impedance control code ICCD to have a third impedance value smaller than the second impedance value in response to the alert signal ALRT having the third state.

As will be described later, the transmission impedance controller 470 may store a table or a firmware that stores the first state, the second state and the third state of the alert signal ALRT and values of the impedance control code ICCD corresponding to the first state, the second state and the third state.

Figure 4A:
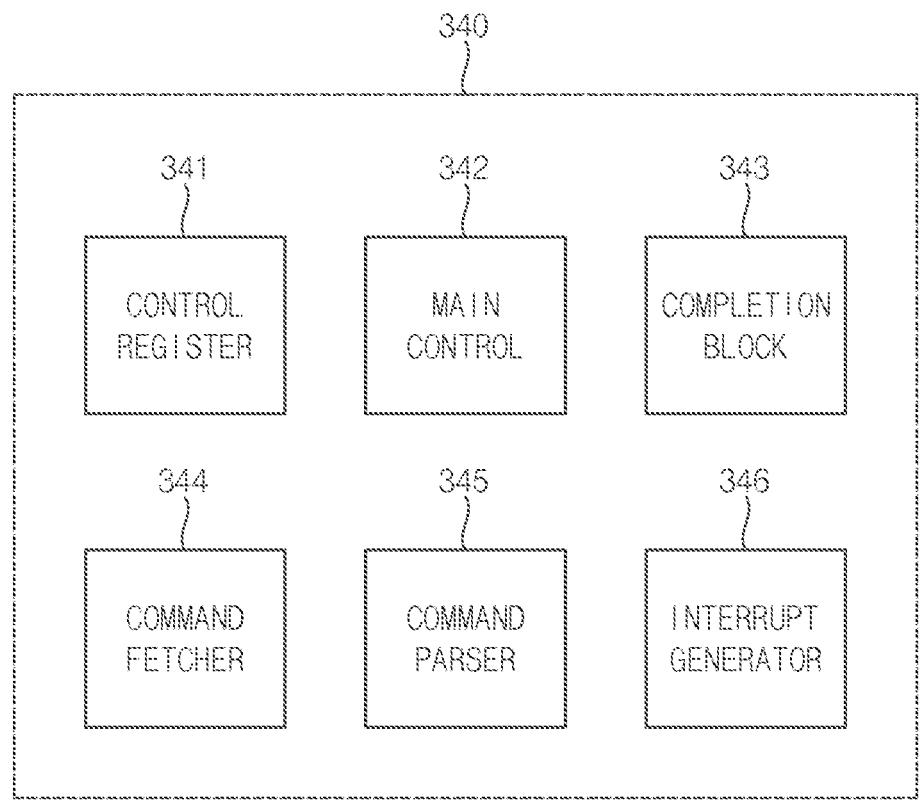
FIG. 4A is a block diagram illustrating an example of the command manager in the storage controller of FIG. 3 according to example embodiments.

FIG. 4A is a block diagram illustrating an example of the command manager in the storage controller of FIG. 3 according to example embodiments.

Referring to FIG. 4A, the command manager 340 may include a control register block 341, a main control block 342, a completion block 343, a command fetch block 344, a command parser 345 and an interrupt generator 346.

The control register block 341 may be configured to include a register capable of being set by the host 100 or to process one or a series of operations for recognizing a register value set by the host 100. For example, the control register block 341 may include various registers for determining information provided from the host 100. The host 100 may notify the command manager 340 of various information by setting a register value of the control register block 341.

The command fetch block 344 may perform or process one or a series of operations for fetching a command stored in the submission queue 131 of the host 100. For example, the command fetch block 344 may transmit a memory read request to the host 100 and may receive a command stored in the submission queue 131 from the host 100.

The main control block 342 may control overall operations of the command manager 340 or may process one or a series of operations to be performed in the command manager 340.

The command parser 345 may parse the command from the host 100 and may provide the parsed command to at least one of the plurality of nonvolatile memory devices NVM 500a, 500b, . . . , 500k through the memory interface circuit 380.

The completion block 343 may process one or a series of operations of writing completion information indicating that an operation is completed, to the completion queue 133 of the host 100. For example, when an operation associated with a command fetched from the host 100 is completed, the completion block 343 may write the completion information indicating that the operation is completed, to the completion queue 133 of the host 100.

The interrupt generator 346 may process one or a series of operations of providing an interrupt signal to the host 100. For example, after the completion block 343 writes the completion information to the completion queue 133, the interrupt generator 346 may notify the host 100 that the completion information is written to the completion queue 133, by providing the interrupt signal to the host 100. In an embodiment, the interrupt signal may be provided in a signaling manner such as pin-based interrupt, message signaled interrupts (MSI), MSI-X, etc.

Figure 4B:
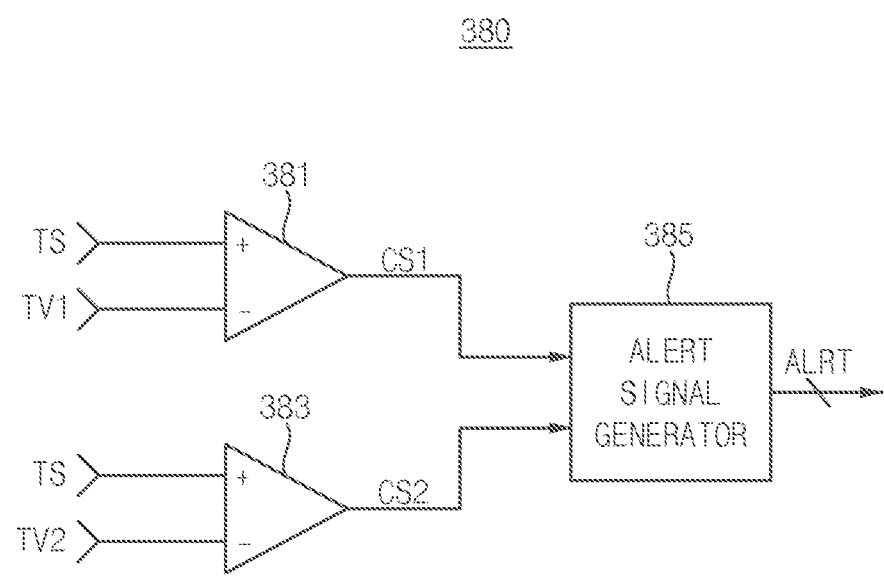
FIG. 4B is a block diagram illustrating an example of the temperature monitor in the storage controller of FIG. 3 according to example embodiments.

FIG. 4B is a block diagram illustrating an example of the temperature monitor in the storage controller of FIG. 3 according to example embodiments.

Referring to FIG. 4B, the temperature monitor 380 may include a first comparator 381, a second comparator 383 and an alert signal generator 385.

The first comparator 381 may compare the temperature signal TS indicating the operating temperature with a first threshold value TV1 and may output a first comparison signal CS1 based on a result of the comparison. The second comparator 383 may compare the temperature signal TS indicating the operating temperature with a second threshold value TV2 and may output a second comparison signal CS2 based on a result of the comparison.

The alert signal generator 385 may receive the first comparison signal CS1 and the second comparison signal CS2, may determine a state of the plurality of bits of the alert signal ALRT based on logic levels of the first comparison signal CS1 and the second comparison signal CS2 and may output the alert signal ALRT.

For example, when the alert signal ALRT includes two bits and the first comparison signal CS1 and the second comparison signal CS2 indicate that the operating temperature is equal to or smaller than the first threshold value TV1, the alert signal generator 385 may generate the alert signal ALRT having a first state of '00'. For example, when the first comparison signal CS1 and the second comparison signal CS2 indicate that the operating temperature exceeds the first threshold value TV1 and is equal to or smaller than the second threshold value TV2, the alert signal generator 385 may generate the alert signal ALRT having a second state of '01'. For example, when the first comparison signal CS1 and the second comparison signal CS2 indicate that the operating temperature exceeds the second threshold value TV2, the alert signal generator 385 may generate the alert signal ALRT having a third state of '11'.

FIG. 5 is a block diagram illustrating an example of the host interface circuit in the storage controller of FIG. 3 according to example embodiments.

Referring to FIG. 5, the host interface circuit 400 may include a receiver 410, a transmitter 440, a locking circuit 490 and a clock multiplier 495.

The locking circuit 490 may receive a reference clock signal CREF from the host 100 and may output an internal reference clock signal iCREF synchronized with the reference clock signal CREF. For example, the locking circuit 490 may include a delay locked loop or a phase locked loop.

The clock multiplier 495 may receive the internal reference clock signal iCREF from the locking circuit 490. The clock multiplier 495 may generate a first clock signal CLK1 and a second clock signal CLK2 through frequency multiplication of the internal reference clock signal iCREF.

The receiver 410 may include an amplifier AMP 415, a reception (RX) equalizer 420, a deserializer 425, a decoder 430 and a receiver logic 435. The transmitter 440 may include a transmitter logic 445, an encoder 450, a serializer 460, a transmission (TX) equalizer 465 and the transmission driver 470.

The amplifier 415 may receive a signal RXS from the host 100 through the link 30. The signal RXS received by the amplifier 415 may be a signal of a first type (e.g., a serial type). The signal RXS received by the amplifier 415 may be a portion of a packet or a portion of a symbol. The amplifier 415 may amplify the received signal RXS and may provide an amplified signal AMS to the reception equalizer 420.

The reception equalizer 420 may receive the amplified signal AMS, may generate an equalized signal REQ by performing an equalization on the amplified signal AMS for compensating for distortion generated in the signal RXS in the link 30 and may provide the equalized signal REQ to the deserializer 415. The deserializer 415 may deserialize (or, parallelize) the equalized signal REQ based on the first clock signal CLK1 to generate with a deserialized signal DSER of a second type (e.g., a parallel type), and may provide the deserialized signal DSER to the decoder 430.

The decoder 430 may perform decoding on the deserialized signal DSER to generate a decoded signal DES For example, the decoder 430 may perform symbol decoding to extract bits from a symbol. The decoder 430 may extract 8-bit data from a 10-bit symbol. Alternatively, the decoder 430 may extract 128-bit data from a 130-bit symbol. The decoder 430 may provide the decoded signal DES to the receiver logic 435.

The receiver logic 435 may perform pattern check on the decoded signal DES to determine compliance. For example, the receiver logic 435 may determine whether the decoded signal coincides with a communication protocol (e.g., a PCIe); when the decoded signal coincides with the communication protocol (e.g., a PCIe), the receiver logic 435 may determine which generation corresponds to a generation of the communication protocol coinciding with the decoded signal. When the pattern check is successful, the receiver logic 435 may provide the decoded signal DES to the processor 310 through the bus 305.

The transmitter logic 445 may receive a signal of the second type (e.g., a parallel type) from the processor 310 through the bus 305. The transmitter logic 445 may combine the signal of the second type and a pattern. For example, the pattern may indicate which generation corresponds to the communication protocol (e.g., a PCIe). The transmitter logic 445 may provide a combined signal TXD to the encoder 450.

The encoder 450 may perform encoding on the combined signal TXD to generate an encoded signal ENS. For example, the encoder 450 may perform symbol encoding to generate a symbol from bits of the combined signal. The encoder 450 may generate a 10-bit symbol from 8-bit data. Alternatively, the encoder 450 may generate a 130-bit symbol from 128-bit data. The encoder 450 may provide the encoded signal to the serializer 460.

The serializer 460 may generate a serialized signal SER of the first type (e.g., a serial type) by performing serialization on the encoded signal ENS based on the second clock signal CLK2 and may provide the serialized signal SER to the transmission equalizer 465. The transmission equalizer 465 may generate an equalized signal TEQ by performing an equalization on the serialized signal SER for compensating for distortion that may occur in the signal in the link 30 and may provide the equalized signal TEQ to the transmission driver 470. As will be described later, the transmission equalizer 465 may include a finite impulse response (FIR) filter and the FIR filter may generate the equalized signal TEQ by performing arithmetic operation on a symbol sequence extracted from the serialized signal SER and a filter coefficient sequence. The transmission equalizer 465 may provide the equalized signal TEQ to the transmission driver 470.

The transmission driver 470 may amplify the equalized signal TEQ to generate a transmission signal TXS and may transmit the transmission signal TXS to the host 100 through the link 30. When the transmission driver 470 amplifies the equalized signal TEQ, the transmission driver 470 may increase an eye height of the transmission signal TXS by reducing (decreasing) an impedance of the transmission driver 470 based on the impedance control code ICCD as the operating temperature increases.

Figure 6A:
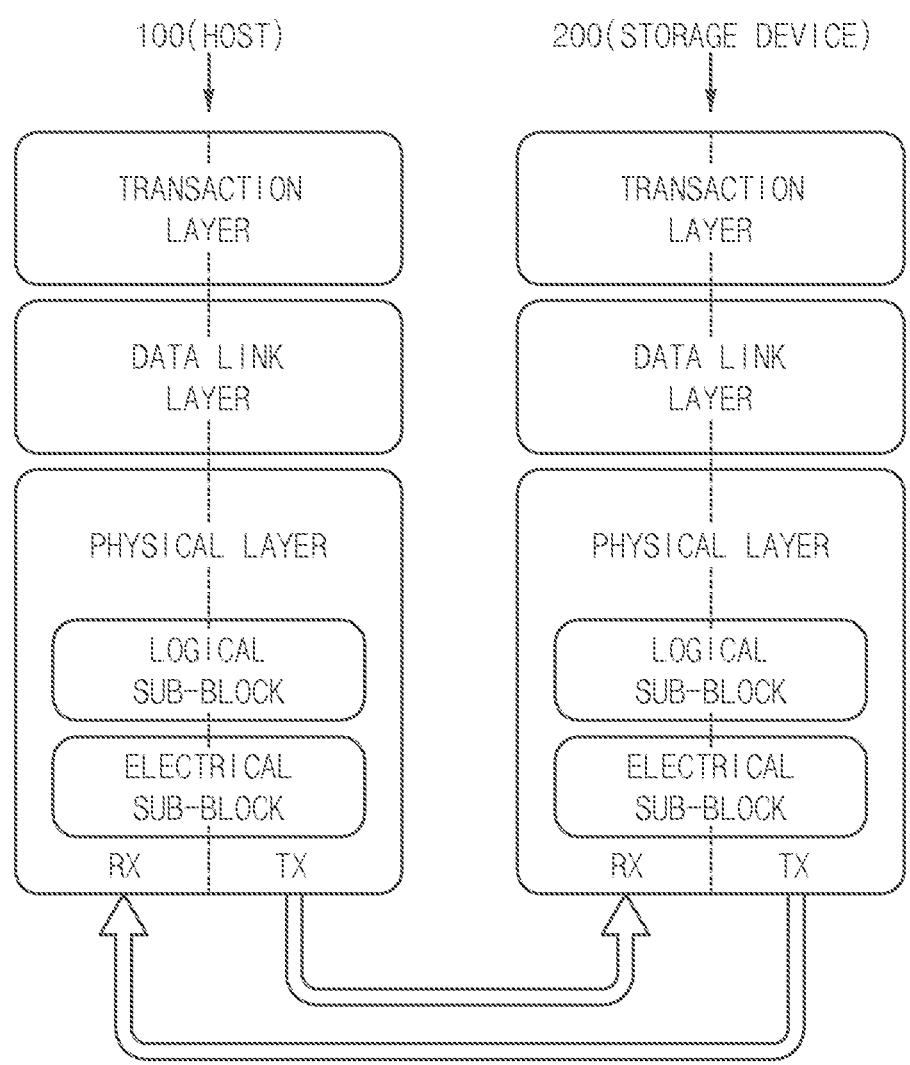
FIGS. 6A and 6B are diagrams illustrating examples of an interconnect architecture applied to a system according to example embodiments.
Figure 6B:
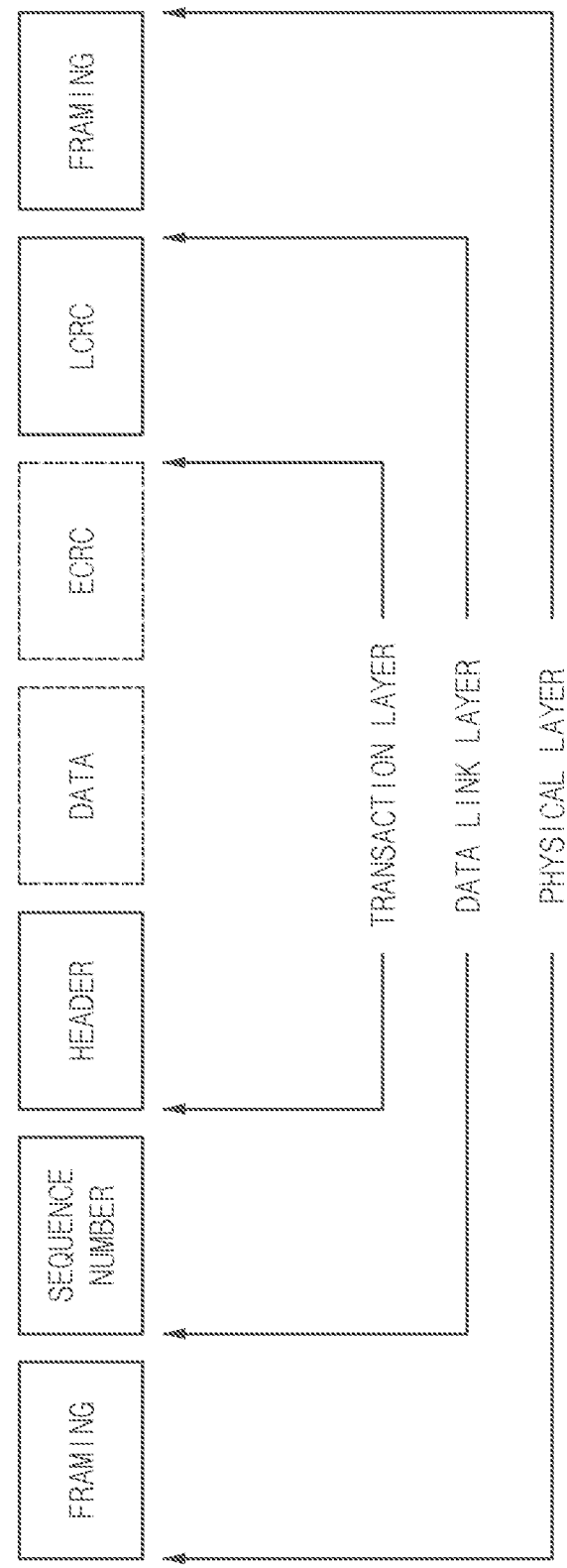

FIGS. 6A and 6B are diagrams illustrating examples of an interconnect architecture applied to a system according to example embodiments.

Referring to FIGS. 6A and 6B, an embodiment of a layered protocol stack is illustrated. A layered protocol stack includes any form of a layered communication stack, such as a Quick Path Interconnect (QPI) stack, a PCIe stack, a next generation high performance computing interconnect stack, or other layered stack. Although example embodiments are in relation to a PCIe stack, the same concepts may be applied to other interconnect stacks. In one embodiment, the protocol stack is a PCIe protocol stack including a transaction layer, a data link layer, and a physical layer.

The PCI Express uses packets to communicate information between components. The packets are formed in the transaction layer and the data Link Layer to carry the information from the transmitting component to the receiving component. As the transmitted packets flow through the other layers, they are extended with additional information necessary to handle packets at those layers. At the receiving side the reverse process occurs and packets get transformed from their physical layer representation to the data link layer representation and finally (for transaction layer packets) to the form that may be processed by the transaction layer of the receiving device.

In one embodiment, the transaction layer is to provide an interface between a device's processing core and the interconnect architecture, such as the data link layer and the physical layer. In this regard, a primary responsibility of the transaction layer is the assembly and disassembly of packets (i.e., the transaction layer packets, or TLPs). The translation layer typically manages credit-based flow control for TLPs. The PCIe implements split transactions, i.e. transactions with request and response separated by time, allowing a link to carry other traffic while the target device gathers data for the response.

In one embodiment, the transaction layer assembles packet header/payload. The payload may include data and an error detection code, i.e. ECRC. Format for current packet headers/payloads may be found in the PCIe specification at the PCIe specification website.

The link layer, also referred to as the data link layer, acts as an intermediate stage between the transaction layer and the physical layer or the PHY layer. In one embodiment, a responsibility of the data link layer is providing a reliable mechanism for exchanging the transaction layer packets (TLPs) between two components 100 (HOST) and 200 (STORAGE DEVICE) through a link. One side of the data link layer accepts TLPs assembled by the transaction layer, applies packet sequence identifier, i.e. a sequence number, an identification number or a packet number, calculates and applies an error detection code, i.e. LCRC, and submits the modified TLPs to the physical layer for transmission across a physical to an external device.

In one embodiment, the physical layer includes a logical sub block and an electrical sub-block to physically transmit a packet to an external device. Here, the logical sub-block is responsible for the "digital" functions of the physical layer. In this regard, the logical sub-block includes a transmitter section to prepare outgoing information for transmission by the physical sub-block, and a receiver section to identify and prepare received information before passing it to the link layer.

The physical block includes a transmitter TX and a receiver RX. The transmitter TX is supplied by the logical sub-block with symbols, which the transmitter serializes and transmits onto to an external device. The receiver RX is supplied with serialized symbols from an external device and transforms the received signals into a bit-stream. The bit-stream is de-serialized and supplied to the logical sub-block. In one embodiment, an 8b/10b transmission code is employed, where ten-bit symbols are transmitted/received. Here, special symbols are used to frame a packet with frames. In addition, in one example, the receiver RX also provides a symbol clock recovered from the incoming serial stream.

As stated above, although the transaction layer, the link layer, and physical layer are discussed in reference to a specific embodiment of a PCIe protocol stack, a layered protocol stack is not so limited. In fact, any layered protocol may be included/implemented.

FIG. 7 illustrates an example of a register of the storage controller of FIG. 3.

The register illustrated in FIG. 7 may be, for example, a link control register for a control of the link 30.

Referring to FIGS. 3 and 7, a 0-th bit and a first bit of the register may be used for active state power management (ASPM) control. A third bit of the register may be used for read completion boundary. A fourth bit of the register may be used for link disable. A fifth bit of the register may be used to retrain the link 30. A retrain may refer to redoing some parts of a transmitter equalization process of the link 30.

A sixth bit of the register may be used for common clock configuration. A seventh bit of the register may be used for extended synch. An eighth bit of the register may be used to enable clock power management. A ninth bit of the register may be used for hardware autonomous width disable.

A tenth bit of the register may be used for a link bandwidth management interrupt enable. An eleventh bit of the register may be used for a link autonomous bandwidth interrupt enable. A fourteenth bit and a fifteenth bit of the register may be used for device readiness status (DRS) signaling control.

A second bit, a twelfth bit, and a thirteenth bit of the register may be used for dynamic link control.

For example, the host 100 may perform polling to read the register periodically. After reading the register, the host 100 and the storage device 200 may decrease multiplication ratios through the retrain operation.

Figure 8A:
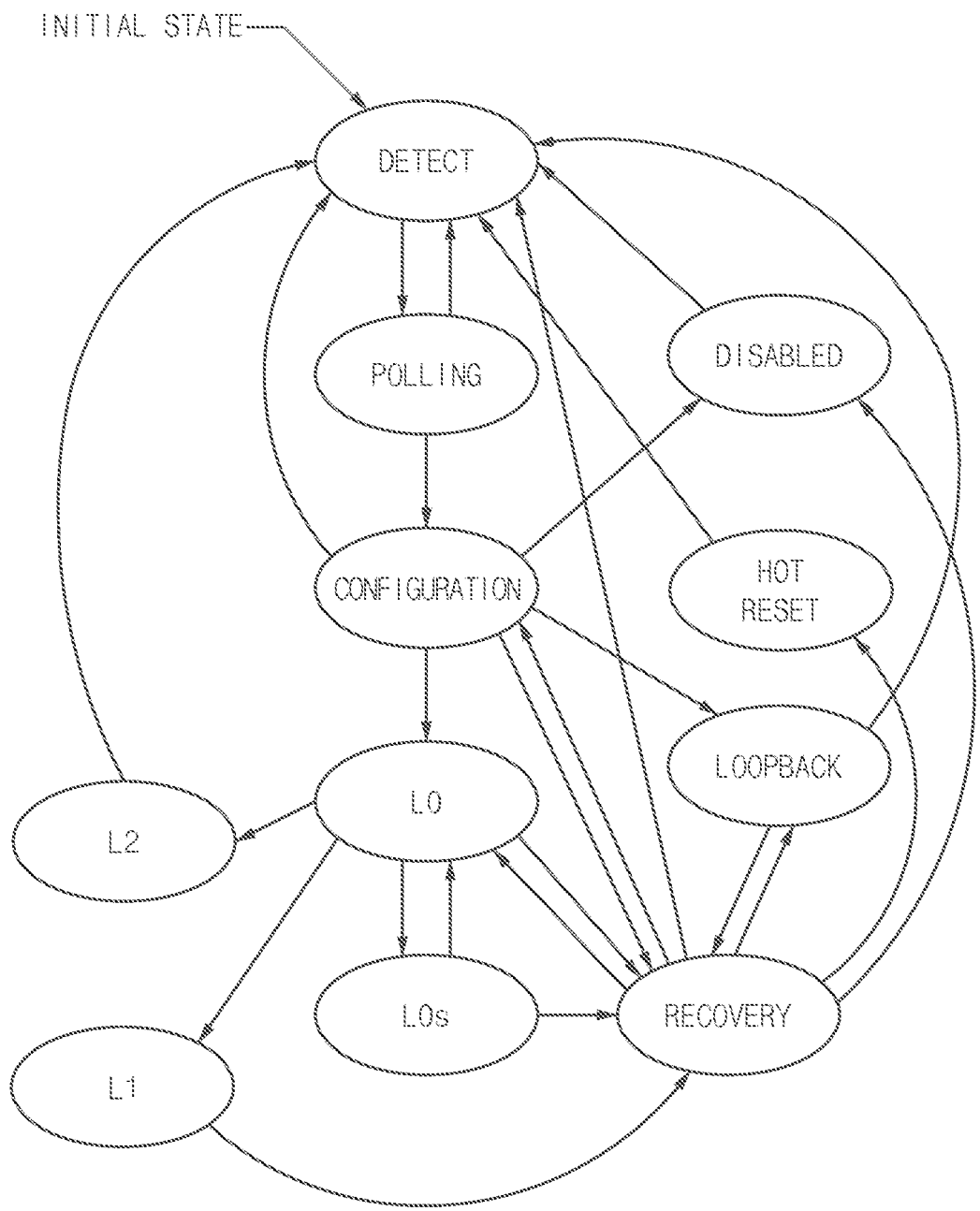
FIG. 8A illustrates a process in which the storage device establishes the link with the host.

FIG. 8A illustrates a process in which the storage device establishes the link with the host.

Referring to FIGS. 1 and 8A, an initial state may be a detect state. In the detect state, when a connection with any other device (e.g., the host device 100) is detected, the storage device 200 may enter a polling state.

In the polling state, a generation version of a protocol (e.g., a PCIe) of the host 100 and a generation version of a protocol (e.g., a PCIe) of the storage device 200 may be checked, and a data transfer rate may be determined based on the highest generation version compatible with each other. Also, in the polling state, the storage controller 300 may set a bit lock, a symbol lock, a block lock, and a lane polarity. In the polling state, the storage controller 300 may transmit TS1 and TS2 being an ordered set at a transmission rate of 2.5 GT/s (gigatransfers per second). A transfer may refer to one data transfer event in a given data-transfer channel.

After the polling state, the storage device 200 may enter a configuration state. In the configuration state, the storage controller 300 may set the number of lanes of the link 30, that is, a link width. Also, in the configuration state, the storage controller 300 may exchange TS1 and TS2 with the host device 100 at a transmission rate of 2.5 GT/s. The storage controller 300 may allocate a lane number and may check and calibrate a lane reversal. The storage controller 300 may de-skew a lane-to-lane timing difference (reduce a time skew between lanes).

After the configuration state, the storage controller 300 may enter an L0 state. The L0 state may be a normal state. In the L0 state, the storage controller 300 may communicate with the host 100 through the link 30.

An L0s state may be an ASPM state. The storage controller 300 may reduce power consumption in the L0s state until the storage controller 300 enters the L0 state. An L1 state may be a power saving state in which power consumption is reduced more than in the L0s state. In an L2 state, a voltage low enough to detect a wake-up event may be used.

Entering a disabled state may be made when the storage controller 300 disables the link 30. A loopback state may be a state that the storage controller 300 uses for test and fault isolation. A hot reset state may be used when the storage controller 300 resets the link 30 through in-band signaling.

A recovery state may be used for the storage controller 300 to adjust a data transfer rate. For example, in the recovery state, the storage controller 300 may adjust the frequency multiplication ratios of a clock multiplier of the host 100 and the clock multiplier 495 of the storage device 200.

For example, by setting the dynamic link control bit of the link control register in the L0 state and requesting the retrain operation, the storage controller 300 may adjust the frequency multiplication ratios of the clock multiplier of the host device 100 and the clock multiplier 495 of the storage device 200.

As the retrain operation is requested, the storage controller 300 may enter the recovery state and may adjust the frequency multiplication ratios of the clock multiplier of the host 100 and the clock multiplier 495 of the storage device 200. Afterwards, the storage controller 300 may return to the L0 state, may return to the configuration state, or may return to the detect state. Alternatively, the storage controller 300 may return to the detect state through the hot reset state.

Figure 8B:
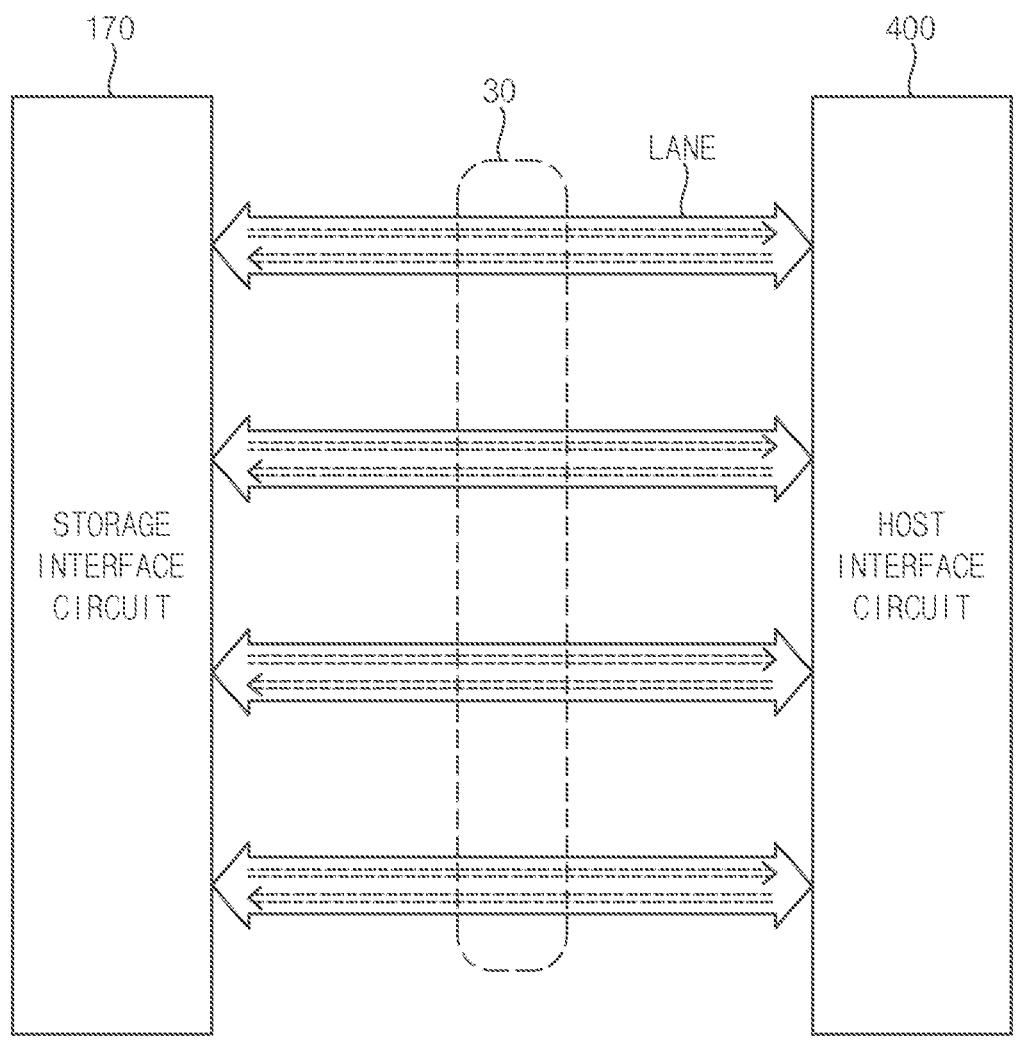
FIG. 8B illustrates an example of the link established between the storage circuit of the host and the host interface circuit of the storage device.

FIG. 8B illustrates an example of the link established between the storage circuit of the host and the host interface circuit of the storage device.

Referring to FIGS. 1, 2, 3, and 8B, the link 30 may include at least one lane LANE.

For example, the link 30 may include lanes LANE, the number of lanes corresponds to a number selected from numbers of 1, 2, 4, 8, and 16. In an example embodiment, it is assumed that four lanes LANE are included in the link 30. The lanes LANE may transmit or receive signals at the same time. The lanes LANE may correspond to parallel signal lines. For example, each lane may contain two pairs of wires, one pair to send and one pair to receive. A link including one lane is thus made up of four wires. The lanes LANE may be set to have the same link speed.

A data transfer rate of the link 30 may be determined by a product of the number of lanes LANE included in the link 30, that is, a link width and a link speed of each of the lanes LANE. To adjust a data transfer rate of the link 30, the storage device 200 according to an example embodiment may adjust a link width, that is, the number of lanes LANE included in the link 30.

Each of the lanes LANE may include a transmit channel and a receive channel. The transmit channel of the host interface circuit 400 may correspond to a dotted arrow facing toward the storage interface circuit 170 from the host interface circuit 400. The receive channel of the host interface circuit 400 may correspond to a dotted arrow facing toward the host interface circuit 400 from the storage interface circuit 170.

Figure 9:
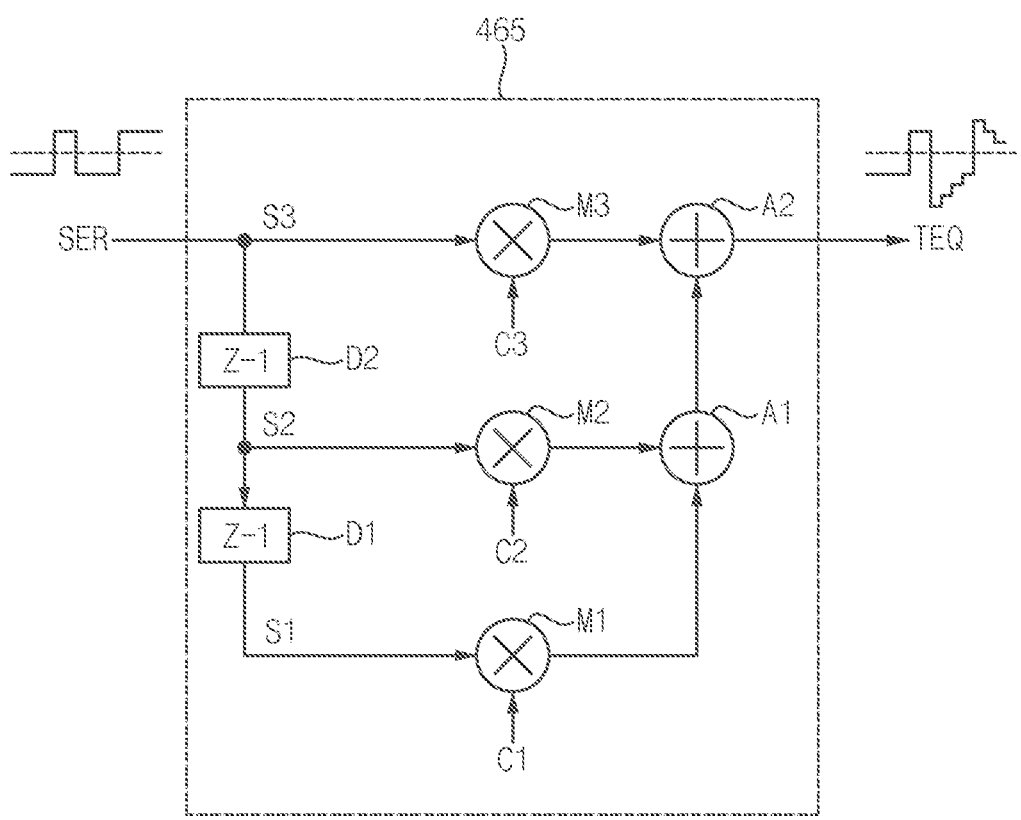
FIG. 9 illustrates an example of the transmission equalizer in the host interface circuit of FIG. 5 according to example embodiments.

FIG. 9 illustrates an example of the transmission equalizer in the host interface circuit of FIG. 5 according to example embodiments.

Referring to FIG. 9, the transmission equalizer 465 may be implemented with an FIR filter and may generate the equalized signal TEQ from the serialized signal SER. In the example of FIG. 9, the transmission equalizer 465 may include two delayers D1 and D2, three multipliers M1, M2 and M3 and two adders A1 and A2 and may operate as a 3-tap feed forward equalizer (FFE).

The transmission equalizer 465 may calculate the symbol sequence in the serialized data SER and a filter coefficient sequence including the filter coefficients of the FIR filter. For example, as shown in FIG. 9, the symbol sequence may include three symbols S1, S2 and S3 corresponding to three filter coefficients C1, C2, and C3 of the filter coefficient sequence, respectively. The three symbols S1, S2 and S3 may be multiplied with the three filter coefficients C1, C2, and C3 respectively, and the multiplication results may be summed.

As such, as illustrated in FIG. 9, the serialized data SER including symbols corresponding to the predetermined levels may be equalized as the equalized signal TEQ including a waveform modified according to the characteristics of the bus 305.

Figure 10:
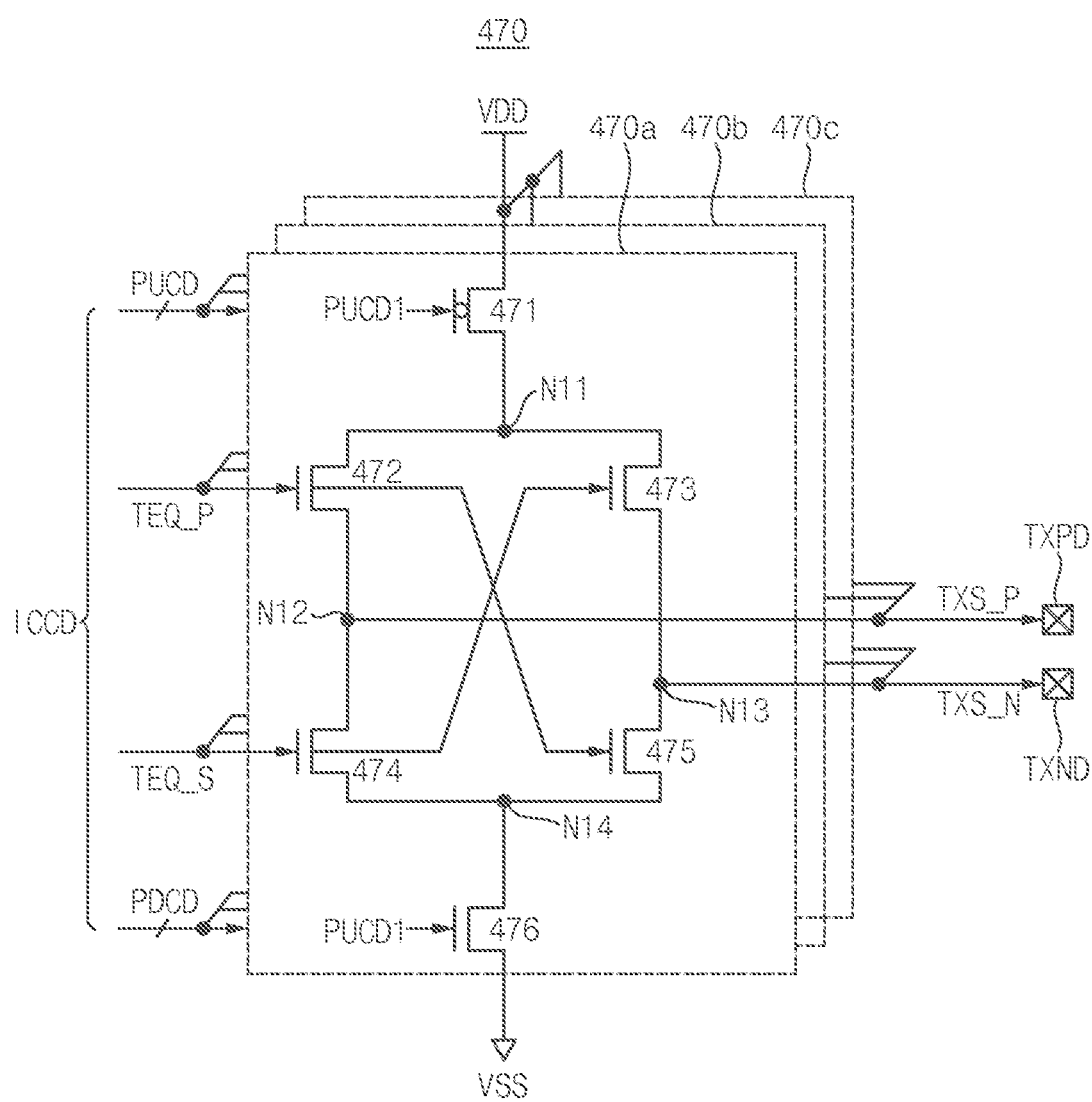
FIG. 10 is a circuit diagram illustrating an example of the transmission driver in the host interface circuit of FIG. 5 according to example embodiments.

FIG. 10 is a circuit diagram illustrating an example of the transmission driver in the host interface circuit of FIG. 5 according to example embodiments.

Referring to FIG. 10, the transmission driver 470 may include a plurality of driver segments 470a, 470b and 470c.

The plurality of driver segments 470a, 470b and 470c may be connected in parallel between a power supply voltage VDD and a ground voltage VSS and may receive a first sub equalization signal TEQ_P and a second sub equalization signal TEQ_S commonly from the transmission equalizer 465.

The transmission driver 470 may adjust the impedance by adjusting a number of driver segments, which are enabled, from among the plurality of driver segments 470a, 470b and 470c, in response to the impedance control code ICCD. The transmission driver 470 may increase a number of driver segments which are enabled, from among the plurality of driver segments 470a, 470b and 470c based on an increase of the operating temperature.

In FIG. 10, a configuration of the driver segment 470a from among the plurality of driver segments 470a, 470b and 470c and each configuration of the driver segments 470b and 470c may be substantially the same as the configuration of the driver segment 470a. In addition, it is assumed that the equalized signal TEQ in FIG. 10 is a differential signal.

The driver segment 470a may include a p-channel metal-oxide semiconductor (PMOS) transistor 471 and first through fifth n-channel metal-oxide semiconductor (NMOS) transistors 472, 473, 474, 475 and 476.

The PMOS transistor 471 may be connected between the power supply voltage VDD and a first node N11 and have a gate to receive a corresponding bit PUCD1 of a pull-up control code PUCD of the impedance control code ICCD.

The first NMOS transistor 472 may be transistor connected between connected between the first node N11 and a second node N12 and have a gate to receive the first sub equalized signal TEQ_P. The second NMOS transistor 473 may be connected between the first node N11 and a third node N13 in parallel with the first NMOS 472 transistor and have a gate to receive the second sub equalized signal TEQ_S. The third NMOS transistor 474 may be connected between the second node N12 and a fourth node N14 and have a gate to receive the second sub equalized signal TEQ_S. The fourth NMOS transistor 475 may be connected between the third node N13 and the fourth node N14 in parallel with the third NMOS transistor 474 and have a gate to receive the first sub equalized signal TEQ_P.

The fifth NMOS transistor 476 may be connected between the fourth node N14 and the ground voltage VSS and have a gate to receive a corresponding bit PDCD1 of a pull-down control code PDCD of the impedance control code ICCD.

A first component TXS_P of the transmission signal TXS is provided to a first transmission pad TXPD at the second node N12 and the first component TXS_P is transmitted to the host 100 through the link 30 and the second component TXS_N of the transmission signal TXS is provided to a second transmission pad TXND at the third node N13 and the second component TXS_N is transmitted to the host 100 through the link 30.

When the driver segment 470a is enabled from among the plurality of driver segments 470a, 470b and 470c in response to the pull-up control code PUCD and the pull-down control code PDCD of the impedance control code ICCD, the transmission driver 470 may provide the impedance having a first impedance value provided by connecting the PMOS transistor 471 and the first through fifth NMOS transistors 472, 473, 474, 475 and 476.

When the driver segments 470a and 470b are enabled from among the plurality of driver segments 470a, 470b and 470c in response to the pull-up control code PUCD and the pull-down control code PDCD of the impedance control code ICCD, the transmission driver 470 may provide the impedance having a second impedance value provided by connecting the PMOS transistor 471 and the first through fifth NMOS transistors 472, 473, 474, 475 and 476. The second impedance value may correspond to two parallel connected impedances having first impedance value.

When the driver segments 470a, 470b and 470c are enabled in response to the pull-up control code PUCD and the pull-down control code PDCD of the impedance control code ICCD, the transmission driver 470 may provide the impedance having a third impedance value provided by connecting the PMOS transistor 471 and the first through fifth NMOS transistors 472, 473, 474, 475 and 476. The third impedance value may correspond to three parallel connected impedances having first impedance value.

Therefore, the transmission driver 470 may reduce the impedance by adjusting a number of driver segments, which are enabled, from among the plurality of driver segments 470a, 470b and 470c, as the operating temperature increases.

Figures 11, 12:
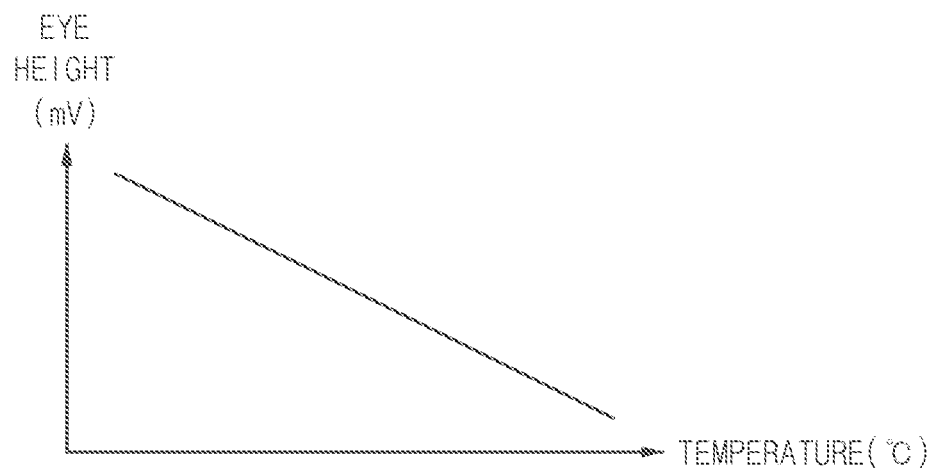
FIG. 11 is a graph illustrating an eye height of a transmission signal received at the host depending on the operating temperature of the storage device.
FIG. 12 is a table illustrating relationship between impedance of the transmission driver of the host interface circuit of FIG. 5 and the eye height of the transmission signal received at the host.

FIG. 11 is a graph illustrating an eye height of a transmission signal received at the host depending on the operating temperature of the storage device.

Referring to FIG. 11, it is noted that an eye height of the transmission signal TXS received at the host 100 decreases as the operating temperature of the storage device 200 increases. The eye height of the transmission signal TXS received at the host 100 decreases because electronics in a path between the storage device 200 and the host move actively and possibility of the transmission signal TXS colliding with the electronics as the operating temperature of the storage device 200 increases.

Therefore, when the storage controller 300 maintains the impedance of the transmission driver 470 as the operating temperature of the storage device 200 increases, the eye height of the transmission signal TXS may be decreased and thus, reliability of the link 30 may be reduced.

FIG. 12 is a table illustrating relationship between impedance of the transmission driver of the host interface circuit of FIG. 5 and the eye height of the transmission signal received at the host.

Referring to FIG. 12, when the impedance of the transmission driver 470 has a first impedance value IMP11, a second impedance value IMP12 and a third impedance value IMP13, respectively, eye height of the transmission signal TXS received at the host 100 has a first eye height EH11, a second eye height EH12 and a third eye height EH13.

The first impedance value IMP11 is greater than the second impedance value IMP12 and the second impedance value IMP12 is greater than the third impedance value IMP13. The second eye height EH12 is greater than the first eye height EH11 and the third eye height EH13 is greater the second eye height EH12. That is, the eye height of the transmission signal TXS received at the host 100 increases as the impedance of the transmission driver 470 decreases.

Figures 13, 14A:
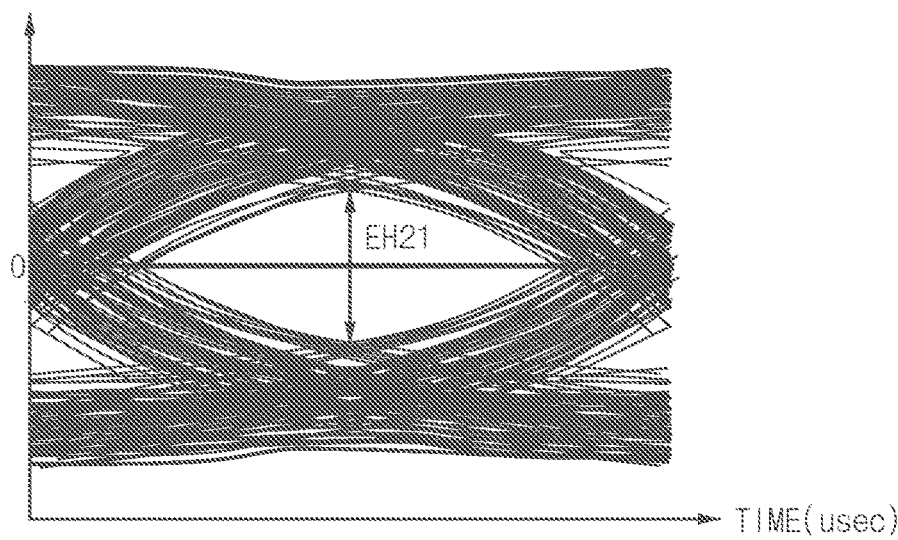
FIG. 13 is a table illustrating relationship between state of the alert signal and impedance of the transmission driver depending on the operating temperature in the storage device according to example embodiments.
FIGS. 14A, 14B and 14C are eye diagrams of a transmission signal received at the host depending on the impedance of the transmission driver according to example embodiments.

FIG. 13 is a table illustrating relationship between state of the alert signal and impedance of the transmission driver depending on the operating temperature in the storage device according to example embodiments.

Referring to FIGS. 3, 4B, 10 and 13, when the operating temperature of the storage device 200 is equal to or greater than a first temperature TEMP1 and is smaller than a second temperature TEMP2, the temperature monitor 380 provides the transmission impedance controller 390 with the alert signal ALRT having a first state of '00', and the transmission impedance controller 390 applies the impedance control code ICCD in response to the alert signal ALRT having the first state such that the impedance of the transmission driver 470 has a first impedance value IMP21. In this case, the eye height of the transmission signal TXS received at the host 100 has a first eye height.

The first impedance value IMP21 may be is determined based on a transmission preset value and a coefficient value optimized for a third phase of equalization process of a PCIe link training between the host 100 and the storage controller 300.

When the operating temperature of the storage device 200 arrives at the second temperature TEMP2 corresponding to the first threshold value TV1, the temperature monitor 380 provides the transmission impedance controller 390 with the alert signal ALRT having a second state of '01', and the transmission impedance controller 390 applies the impedance control code ICCD in response to the alert signal ALRT having the second state such that the impedance of the transmission driver 470 has a second impedance value IMP22 smaller than the first impedance value IMP21. That is, when the operating temperature of the storage device 200 is equal to or greater than the second temperature TEMP2 and is smaller than a third temperature TEMP3, the impedance of the transmission driver 470 has the second impedance value IMP22 and the eye height of the transmission signal TXS received at the host 100 has a second eye height greater than the first eye height.

When the operating temperature of the storage device 200 arrives at the third temperature TEMP3 corresponding to the second threshold value TV2, the temperature monitor 380 provides the transmission impedance controller 390 with the alert signal ALRT having a third state of '11', and the transmission impedance controller 390 applies the impedance control code ICCD in response to the alert signal ALRT having the third state such that the impedance of the transmission driver 470 has a third impedance value IMP23 smaller than the second impedance value IMP22. That is, when the operating temperature of the storage device 200 is equal to or greater than the third temperature TEMP3, the impedance of the transmission driver 470 has the third impedance value IMP23 and the eye height of the transmission signal TXS received at the host 100 has a third eye height greater than the second eye height.

Figure 14B:
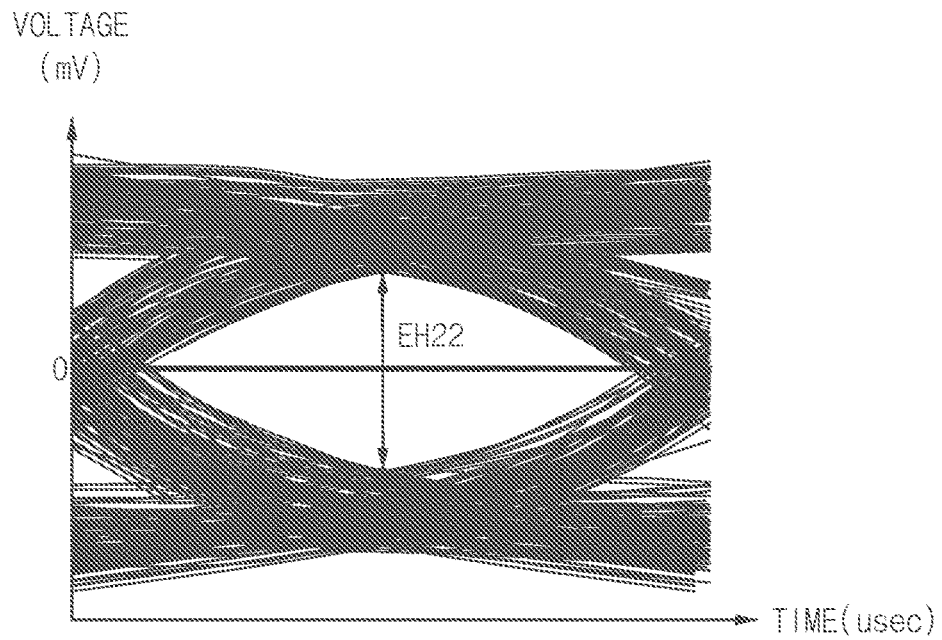
Figure 14C:
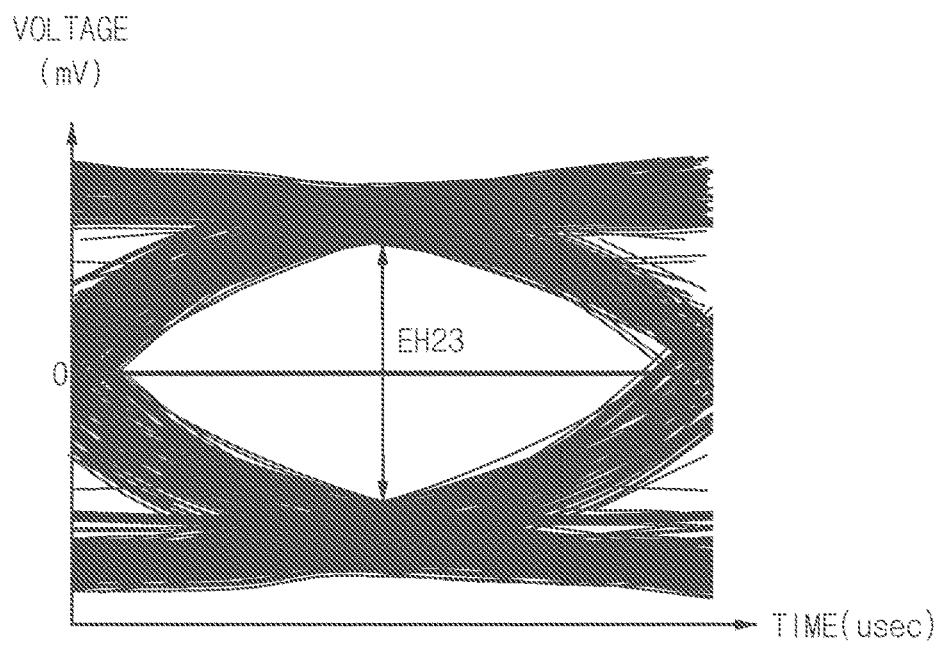

FIGS. 14A, 14B and 14C are eye diagrams of a transmission signal received at the host depending on the impedance of the transmission driver according to example embodiments.

In FIGS. 14A, 14B and 14C, a horizontal axis denotes time and a vertical axis denotes a voltage level of the transmission signal TXS received at the host 100.

FIG. 14A illustrates an eye diagram of the transmission signal TXS received at the host 100 when the impedance of the transmission driver 470 has the first impedance value IMP21. The transmission signal TXS has a first eye height EH21.

FIG. 14B illustrates an eye diagram of the transmission signal TXS received at the host 100 when the impedance of the transmission driver 470 has the second impedance value IMP22. The transmission signal TXS has a second eye height EH22 greater than the first eye height EH21.

FIG. 14C illustrates an eye diagram of the transmission signal TXS received at the host 100 when the impedance of the transmission driver 470 has the third impedance value IMP23. The transmission signal TXS has a third eye height EH23 greater than the second eye height EH22.

Figure 15:
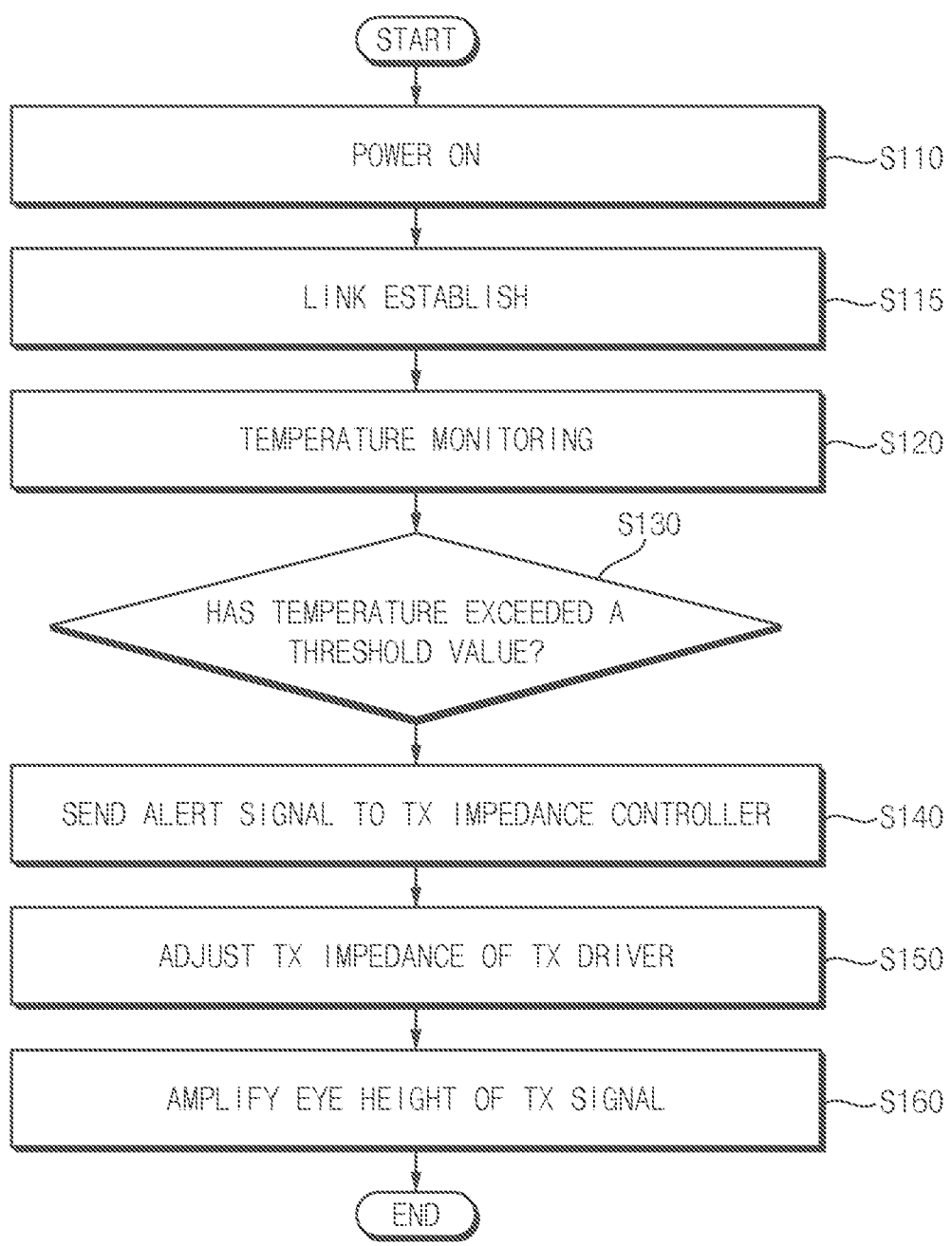
FIG. 15 is a flow chart illustrating a method of operating a storage device according to example embodiments.

FIG. 15 is a flow chart illustrating a method of operating a storage device according to example embodiments.

Referring to FIGS. 1 through 15, a power is applied to the storage system 50 (operation S110). That is, the storage system 50 is powered on. The link 30 is established between the host 100 and the storage device 200 (operation S115) and the storage device 200 starts normal operation. The temperature monitor 380 in the storage controller 300 performs temperature monitoring based on the temperature signal TS from the temperature sensor 370 (operation S120) and determines whether the operating temperature exceeds at least one threshold value (operation S130).

When operating temperature does not exceed the at least one threshold value (NO in operation S130), the temperature monitor 380 monitors the operating temperature while providing the transmission impedance controller 390 with the alert signal ALRT having a first state.

When the operating temperature exceeds the at least one threshold value (YES in operation S130), the temperature monitor 380 provides the transmission impedance controller 390 with the alert signal ALRT having a second state different from the first state (operation S140) and notifies the transmission impedance controller 390 of the operating temperature exceeding the at least one threshold value.

The transmission impedance controller 390 adjusts the impedance of the transmission driver 470 by applying the impedance control code ICCD to the transmission driver 470 (operation S150). The transmission driver 470 drives the transmission signal TXS based on the adjusted impedance value to increase an eye height of the transmission signal TXS (operation S160).

Therefore, the storage device and the method of operating a storage device according to example embodiments, may increase an eye height of the transmission signal transmitted to the host through the link by decreasing impedance of the transmission driver as the operating temperature increases. Therefore, the storage device and the method of operating a storage device according to example embodiments may maintain reliability of the link 30 even though the operating temperature of the storage device 200 increases.

Figure 16:
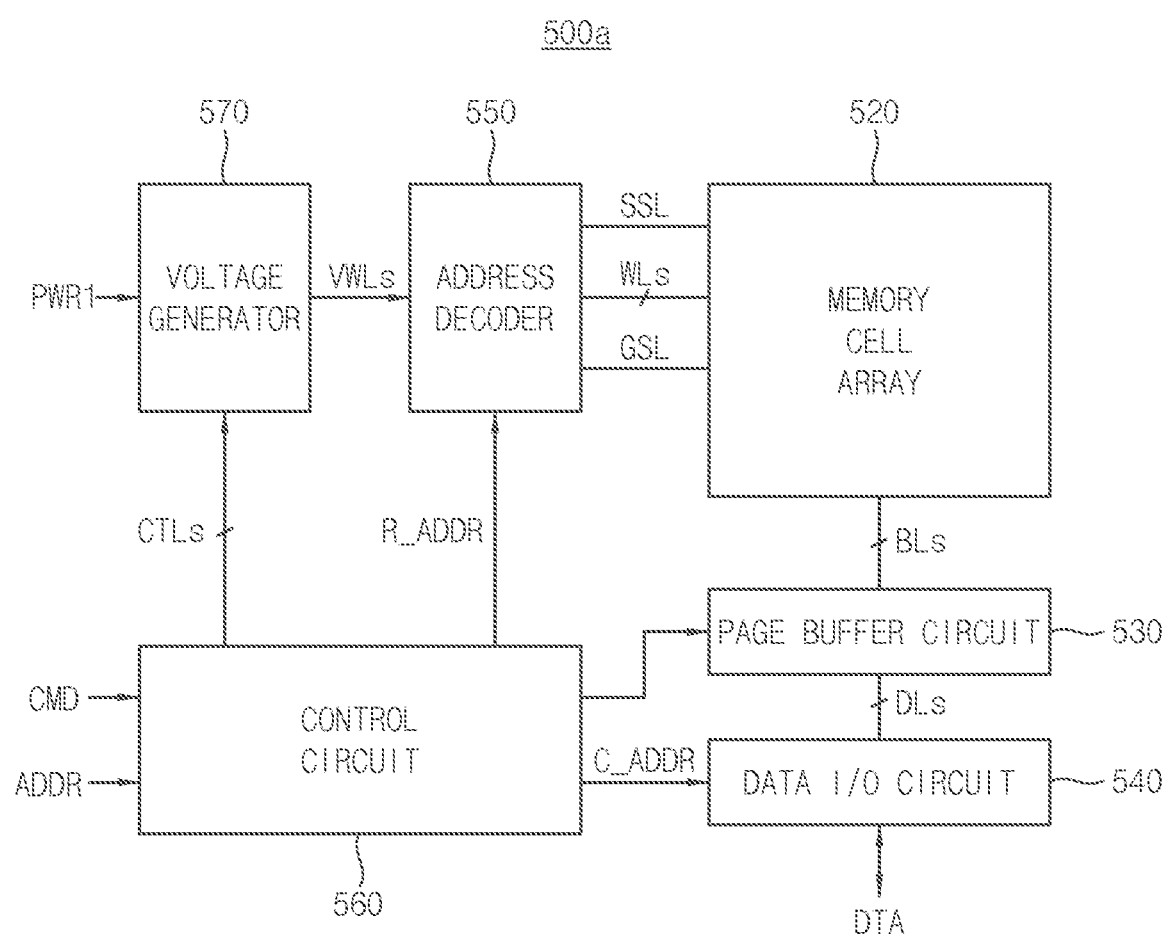
FIG. 16 is a block diagram illustrating an example of one of the plurality of nonvolatile memory devices in the storage system of FIG. 1 according to some example embodiments.

FIG. 16 is a block diagram illustrating an example of one of the plurality of nonvolatile memory devices in the storage system of FIG. 1 according to some example embodiments.

In FIG. 16, a configuration of the nonvolatile memory device 500a is illustrated and each configuration of the nonvolatile memory devices 500b, . . . , 500k may be substantially the same as the configuration of the nonvolatile memory device 500a.

Referring to FIG. 16, the nonvolatile memory device 500a may include a memory cell array 520, an address decoder 550, a page buffer circuit 530, a data input/output (I/O) circuit 540, a control circuit 560, and a voltage generator 570.

The memory cell array 520 may be coupled to the address decoder 550 through a string selection line SSL, a plurality of word-lines WLs, and a ground selection line GSL. In addition, the memory cell array 520 may be coupled to the page buffer circuit 530 through a plurality of bit-lines BLs.

The memory cell array 520 may include a plurality of memory cells coupled to the plurality of word-lines WLs and the plurality of bit-lines BLs.

In some example embodiments, the memory cell array 520 may be or include a three-dimensional memory cell array, which is formed on a substrate in a three-dimensional structure (e.g., a vertical structure). In this case, the memory cell array 520 may include vertical cell strings that are vertically oriented such that at least one memory cell is located over another memory cell.

Figure 17:
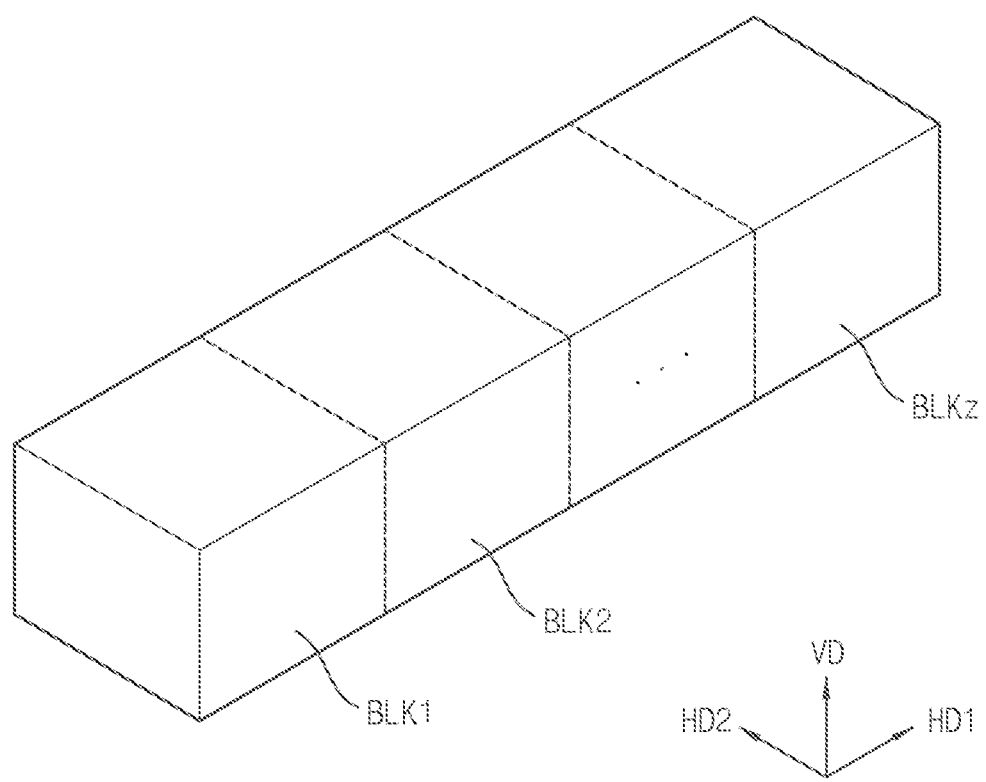
FIG. 17 is a block diagram illustrating the memory cell array in the nonvolatile memory device of FIG. 16.

FIG. 17 is a block diagram illustrating the memory cell array in the nonvolatile memory device of FIG. 16.

Referring to FIG. 17, the memory cell array 520 may include a plurality of memory blocks BLK1 to BLKz. Here, z may be an integer greater than two. The memory blocks BLK1 to BLKz extend along a first horizontal direction HD1, a second horizontal direction HD2 and a vertical direction VD. In some example embodiments, the memory blocks BLK1 to BLKz are selected by the address decoder 550 in FIG. 16. For example, the address decoder 550 may select a memory block BLK corresponding to a block address among the memory blocks BLK1 to BLKz.

Figure 18:
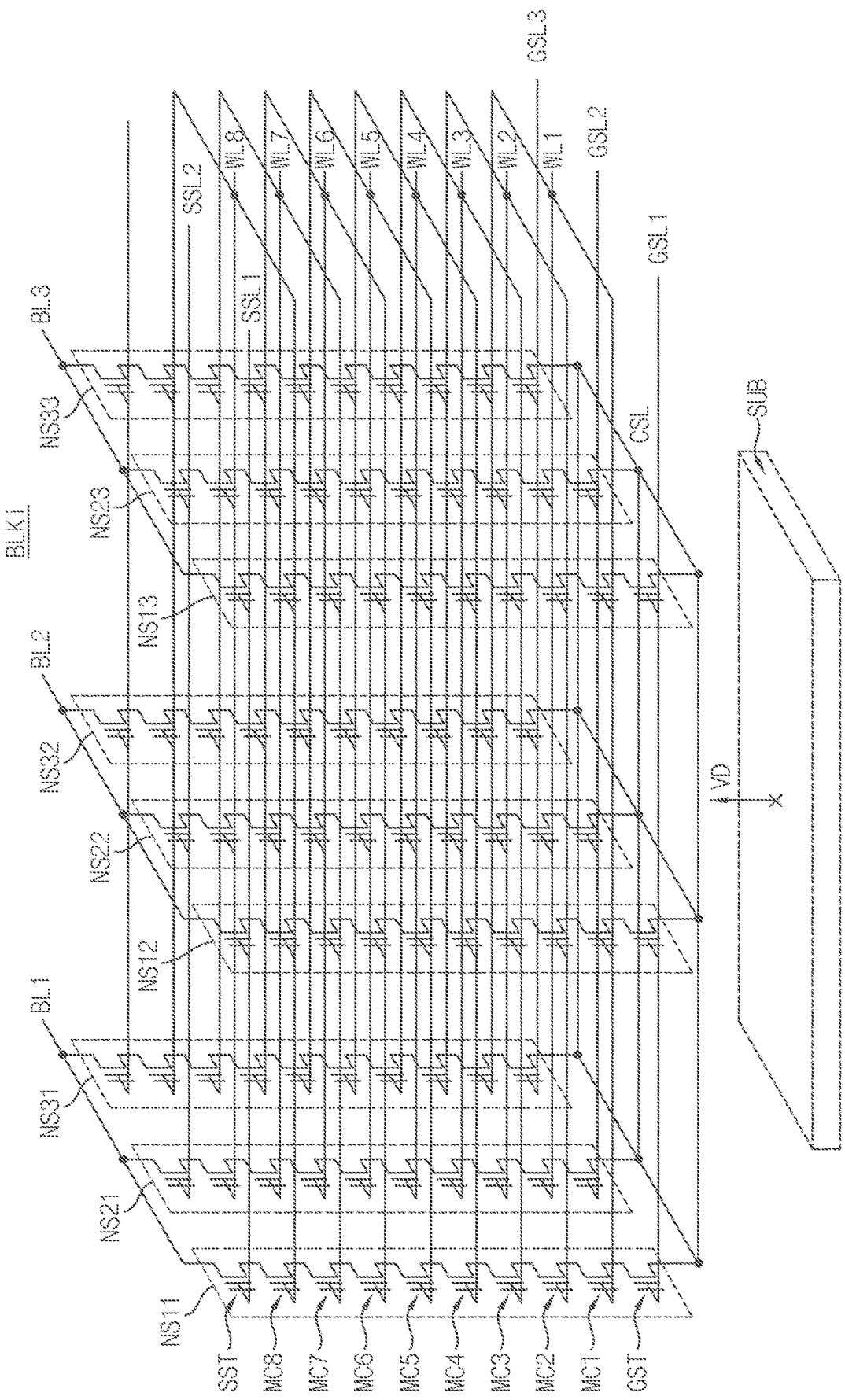
FIG. 18 is a circuit diagram illustrating one of the memory blocks of FIG. 17.

FIG. 18 is a circuit diagram illustrating one of the memory blocks of FIG. 17.

The memory block BLKi of FIG. 18 may be formed on a substrate SUB in a three-dimensional structure (or a vertical structure). For example, a plurality of memory cell strings included in the memory block BLKi may be formed in the direction VD perpendicular to the substrate SUB.

Referring to FIG. 18, the memory block BLKi may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 18, each of the memory cell strings NS11 to NS33 is illustrated to include eight memory cells MC1 to MC8. However, present disclosures are not limited thereto. In some example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 18, the memory block BLKi is illustrated to be coupled to eight word-lines WL1 to WL8 and three bit-lines BL1 to BL3. However, present disclosures are not limited thereto. In some example embodiments, the memory cell array 520 may be coupled to any number of word-lines and bit-lines.

Figure 19:
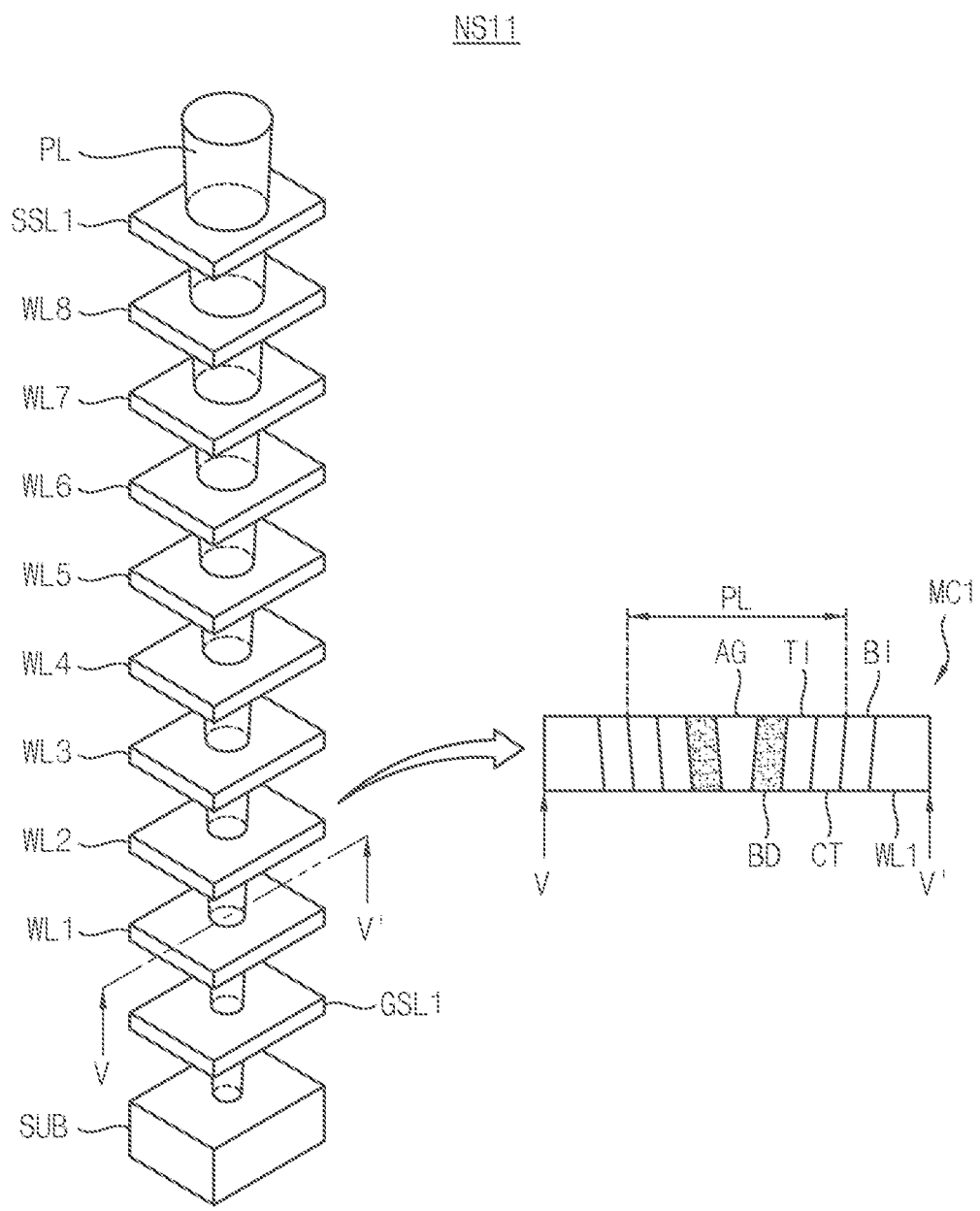
FIG. 19 illustrates an example of a structure of a cell string CS in the memory block of FIG. 18.

FIG. 19 illustrates an example of a structure of a cell string CS in the memory block of FIG. 18.

Referring to FIGS. 18 and 19, a pillar PL is provided on the substrate SUB such that the pillar PL extends in a direction perpendicular to the substrate SUB to make contact with the substrate SUB. Each of the ground selection line GSL, the word lines WL1 to WL8, and the string selection lines SSL illustrated in FIG. 18 may be formed of a conductive material parallel with the substrate SUB, for example, a metallic material. The pillar PL may be in contact with the substrate SUB through the conductive materials forming the string selection lines SSL, the word lines WL1 to WL8, and the ground selection line GSL.

A sectional view taken along a line V-V' is also illustrated in FIG. 19. In some example embodiments, a sectional view of a first memory cell MC1 corresponding to a first word line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word line WL and the pillar PL. The body BD, the tunnel insulating layer TI, the charge trap layer CT, the blocking insulating layer BI, and the first word line WL may constitute or be included in a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

Referring back to FIG. 16, the control circuit 560 may receive the command (signal) CMD and the address (signal) ADDR from the storage controller 300, and may control an erase loop, a program loop and/or a read operation of the nonvolatile memory device 500a based on the command signal CMD and the address signal ADDR. The program loop may include a program operation and a program verification operation. The erase loop may include an erase operation and an erase verification operation.

For example, the control circuit 560 may generate control signals CTLs, which are used for controlling the voltage generator 570, based on the command signal CMD, and generate a row address R_ADDR and a column address C_ADDR based on the address signal ADDR. The control circuit 560 may provide the row address R_ADDR to the address decoder 550 and may provide the column address C_ADDR to the data I/O circuit 540.

The address decoder 550 may be coupled to the memory cell array 520 through the string selection line SSL, the plurality of word-lines WLs, and the ground selection line GSL. During the program operation or the read operation, the address decoder 550 may determine one of the plurality of word-lines WLs as a first word-line (e.g., a selected word-line) and determine rest of the plurality of word-lines WLs except for the first word-line as unselected word-lines based on the row address R_ADDR.

The voltage generator 570 may generate word-line voltages VWLs, which are required for the operation of the nonvolatile memory device 500a, based on the control signals CTLs. The voltage generator 570 may receive a power PWR1 from the storage controller 300. The word-line voltages VWLs may be applied to the plurality of word-lines WLs through the address decoder 550.

For example, during the erase operation, the voltage generator 570 may apply an erase voltage to a well of the memory block and may apply a ground voltage to entire word-lines of the memory block. During the erase verification operation, the voltage generator 570 may apply an erase verification voltage to the entire word-lines of the memory block or sequentially apply the erase verification voltage to word-lines in a word-line basis.

For example, during the program operation, the voltage generator 570 may apply a program voltage to the first word-line and may apply a program pass voltage to the unselected word-lines. In addition, during the program verification operation, the voltage generator 570 may apply a program verification voltage to the first word-line and may apply a verification pass voltage to the unselected word-lines.

Furthermore, during the read operation, the voltage generator 570 may apply a read voltage to the first word-line and may apply a read pass voltage to the unselected word-lines.

The page buffer circuit 530 may be coupled to the memory cell array 520 through the plurality of bit-lines BLs. The page buffer circuit 530 may include a plurality of page buffers. In some example embodiments, one page buffer may be connected to one bit-line. In some example embodiments, one page buffer may be connected to two or more bit-lines.

The page buffer circuit 530 may temporarily store data to be programmed in a selected page or data read out from the selected page.

The data I/O circuit 540 may be coupled to the page buffer circuit 430 through data lines DLs. During the program operation, the data input/output circuit 540 may receive the data DTA from the storage controller 300 provide the data DTA to the page buffer circuit 530 based on the column address C_ADDR received from the control circuit 560.

During the read operation, the data I/O circuit 540 may provide the data DTA which are stored in the page buffer circuit 430, to the storage controller 300 based on the column address C_ADDR received from the control circuit 560.

The control circuit 560 may control the page buffer circuit 530 and data I/O circuit 540.

Figure 20:
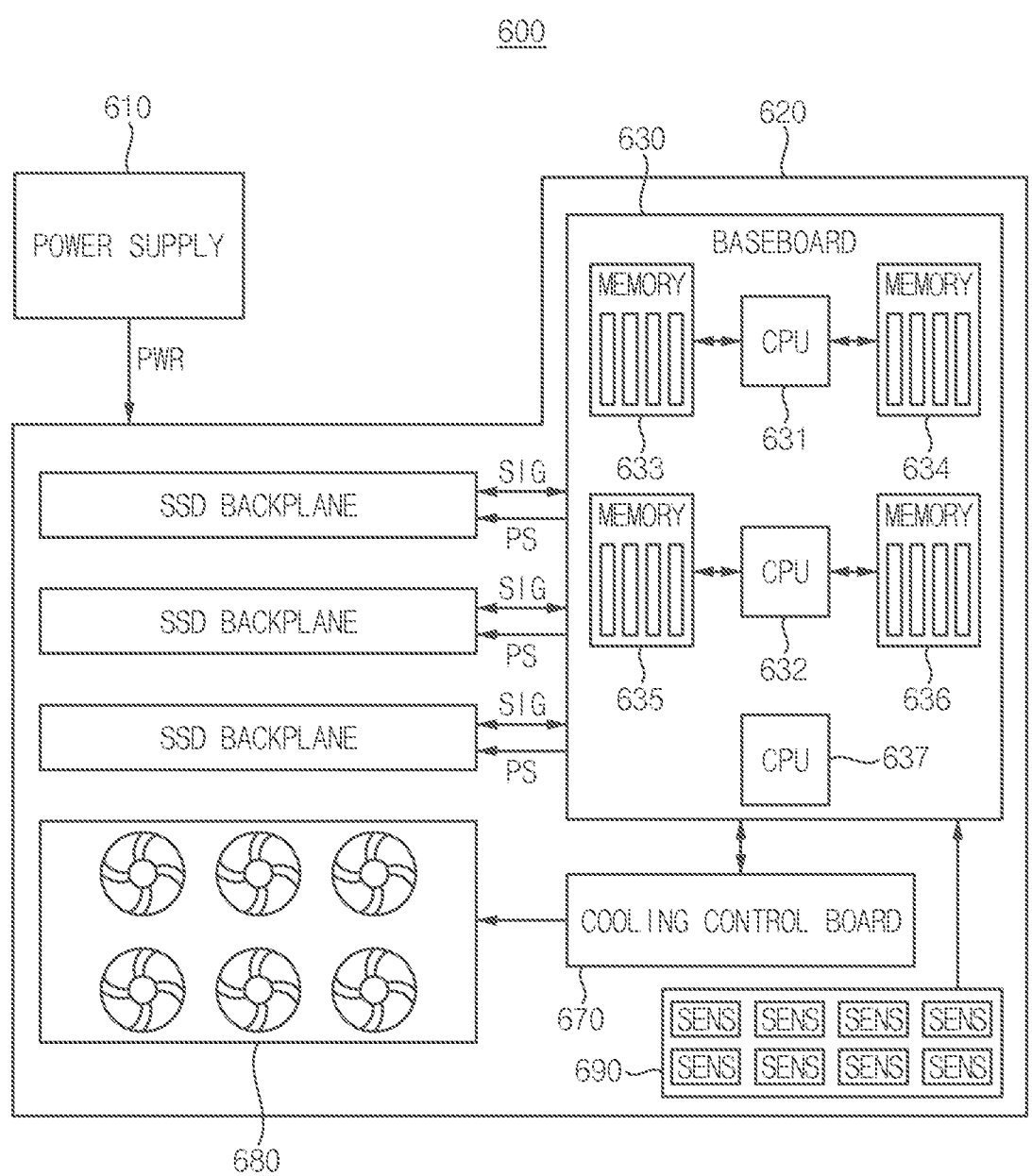
FIG. 20 is a block diagram illustrating an electronic device according to example embodiments.

FIG. 20 is a block diagram illustrating an electronic device according to example embodiments. The electronic device 600 may correspond to a server.

Referring to FIG. 20, the electronic device 600 may be, e.g., a server. The electronic device 600 may include a power supply 610 and a power receiver 620. The power supply 610 may generate a power PWR from an external power, and may supply the generated power PWR to the power receiver 620. The power PWR may be provided in the form of two or more different voltages.

The power receiver 620 may receive the power PWR from the power supply 610, and may operate based on the power PWR. The power receiver 620 may include a baseboard 630, a first solid state drive (SSD) backplane 640, a second SSD backplane 650, a third SSD backplane 660, a cooling control board 670, coolers 680, and sensors 690.

The baseboard 630 may include a first central processing unit (CPU) 631, a second CPU 632, first memories 633 and second memories 634 connected with the first CPU 631, third memories 635 and fourth memories 636 connected with the second CPU 632, and a baseboard management controller (BMC) 637. The baseboard 630 may supply the power PWR received from the power supply 610 to the first CPU 631, the second CPU 632, the first memories 633, the second memories 634, the third memories 635, and the fourth memories 636.

The first CPU 631 may use the first memories 633 and the second memories 634 as working memories. The second CPU 632 may use the third memories 635 and the fourth memories 636 as working memories. The first CPU 631 and the second CPU 632 may execute an operating system and various applications. The first CPU 631 and the second CPU 632 may control components of the power receiver 620. For example, the first CPU 631 and the second CPU 632 may control the components of the power receiver 620 based on PCIe.

The first CPU 631 and the second CPU 632 may access the first SSD backplane 640, the second SSD backplane 650, and the third SSD backplane 660. For example, the first CPU 631 and the second CPU 632 may access the first SSD backplane 640, the second SSD backplane 650, and the third SSD backplane 660 based on nonvolatile memory express (NVMe). The first memories 633, the second memories 634, the third memories 635, and the fourth memories 636 may include dual in-line memory module (DIMM) memories installed in DIMM slots.

The BMC 637 may be a separate system that is separate from an operating system of the first CPU 631 and the second CPU 632. The BMC 637 may collect information from the components of the electronic device 600, and may access the components. The BMC 637 may be based on a separate communication interface that is separate from communication interfaces (e.g., PCIe) of the first CPU 631 and the second CPU 632. For example, the BMC 637 may be based on an intelligent platform management interface (IPMI). The communication interface of the BMC 637 may communicate with the communication interfaces of the first CPU 631 and the second CPU 632.

The first SSD backplane 640 may receive the power PWR from the power supply 610, may exchange signals SIG with the baseboard 630, and may receive power signals PS from the baseboard 630. The first SSD backplane 640 may exchange the signals SIG with the first CPU 631, the second CPU 632, or the BMC 637 of the baseboard 630, and may receive the power signals PS therefrom. A plurality of SSDs may be installed in the first SSD backplane 640. This may mean that the first SSD backplane 640 includes a plurality of SSDs.

The first CPU 631 and the second CPU 632 of the baseboard 630 may access (e.g., write, read, and erase) the SSDs of the first SSD backplane 640 through the signals SIG. The BMC 637 of the baseboard 630 may monitor the first SSD backplane 640 through the signals SIG, and may access and control the first SSD backplane 640. The first CPU 631, the second CPU 632, or the BMC 637 of the baseboard 630 may power on or power off the first SSD backplane 640 by using the power signals PS.

Structures and operations of the second SSD backplane 650 and the third SSD backplane 660 may be the same as the structure and the operation of the first SSD backplane 640. Thus, additional description will be omitted to avoid redundancy.

The baseboard 630 may power on and power off the first SSD backplane 640, the second SSD backplane 650, and the third SSD backplane 660 independently of each other. For example, services that are supported by using the first SSD backplane 640, the second SSD backplane 650, and the third SSD backplane 660 may be different. While the electronic device 600 does not provide a specific service, an SSD backplane corresponding to the specific service may be powered off, and the remaining SSD backplane(s) may be powered on.

For example, the frequencies of use of the services that are supported by using the first SSD backplane 640, the second SSD backplane 650, and the third SSD backplane 660 may be different for each time zone. In a time zone when the frequencies of use of the services that are supported by using the first SSD backplane 640, the second SSD backplane 650, and the third SSD backplane 660 are low, at least one of the first SSD backplane 640, the second SSD backplane 650, and the third SSD backplane 660 may be powered off.

The cooling control board 670 may receive the power PWR from the power supply 610. The cooling control board 670 may control the coolers 680 under control of the baseboard 630. For example, the cooling control board 670 may control the coolers 680 under control of the first CPU 631, the second CPU 632, or the BMC 637 of the baseboard 630. The cooling control board 670 may control operation activation and deactivation of the coolers 680 and the intensity of cooling.

The coolers 680 may receive the power PWR from the power supply 610. The coolers 680 may perform cooling under control of the cooling control board 670 such that a temperature of the electronic device 600 decreases. The coolers 680 may include fans, but embodiments are not limited thereto. The coolers 680 are not limited to the case where the coolers 680 are collectively disposed at one place. For example, the coolers 680 may be distributed and disposed at two or more places. A part of the coolers 680 may be attached to a chassis of the electronic device 600 and may inject an external air into the electronic device 600. The rest of the coolers 680 may be disposed at a specific component and may take full charge of cooling of the specific component.

The sensors (SENS) 690 may receive the power PWR from the power supply 610. The sensors 690 may be disposed adjacent to the components of the electronic device 600. The sensors 690 may collect a variety of information under control of the baseboard 630, and may provide the collected information to the baseboard 630.

For example, the sensors 690 may collect information under control of the BMC 637 of the baseboard 630, and may provide the collected information to the BMC 637. The sensors 690 may provide the collected information to the BMC 637 through sensor data repository (SDR) of the IPMI. For example, different record IDs may be assigned to the sensors 690. The sensors 690 may provide information to the BMC 637 based on different record IDs. The sensors 690 may include various sensors such as a temperature sensor, a humidity sensor, and a vibration sensor.

Figure 21:
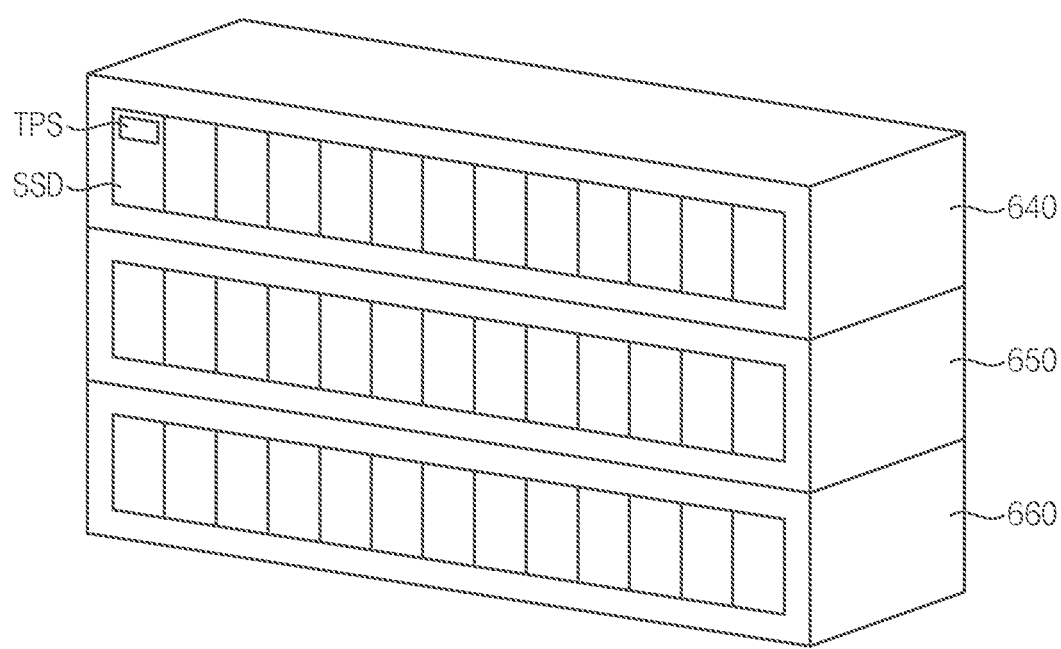
FIG. 21 illustrates an example in which SSDs are installed in the first SSD backplane, the second SSD backplane, and the third SSD backplane.

FIG. 21 illustrates an example in which SSDs are installed in the first SSD backplane, the second SSD backplane, and the third SSD backplane.

Referring to FIGS. 20 and 21, to reduce the size of the electronic device 600, SSDs may be closely installed in each of the first SSD backplane 640, the second SSD backplane 650, and the third SSD backplane 660. Also, to reduce the size of the electronic device 600, the first SSD backplane 640, the second SSD backplane 650, and the third SSD backplane 660 may be in close contact with each other. Each of the SSDs may correspond to the storage device 200 in FIG. 1 and each of SSDs may include a storage controller and a plurality of nonvolatile memory devices and may include a temperature sensor TPS.

When one of the first SSD backplane 640, the second SSD backplane 650, and the third SSD backplane 660 is in a power-off state, the remaining SSD backplanes may be in a power-on state. A temperature of the SSD backplane being in the power-off state may increase due to heat generated at the SSD backplanes being in the power-on state. A temperature of the SSD backplane being in the power-off state may increase due to heat convected by the coolers 680.

When a temperature of the SSD backplane that is in the powered-off state increases, the increased temperature may accelerate a reduction of retention of the SSDs installed in the powered-off SSD backplane. The reduction of retention may be recovered by a retention recovery operation. However, the retention recovery operation is not performed when the SSD backplane is in the power-off state. Accordingly, due to the reduction of retention, a data loss may occur at the SSDs installed in the SSD backplane being in the power-off state.

As such, the electronic device 600 according to an example embodiment may power on at least one of SSDs installed in an SSD backplane that is in a power-off state in response to an increase in a temperature of the powered-off SSD backplane. The powered-on SSD(s) may perform the retention recovery operation to recover the reduction of retention. Accordingly, data can be prevented from being lost due to the reduction of retention accelerated by a high temperature at an SSD backplane being in a power-off state.

In addition, the operating temperature of the SSDs installed in each of the first SSD backplane 640, the second SSD backplane 650, and the third SSD backplane 660 may vary depending on distance from the coolers 680, and thus, a characteristic of the signal SIG transmitted to the based board 630 may vary. Each of the SSDs installed in each of the first SSD backplane 640, the second SSD backplane 650, and the third SSD backplane 660 may include a temperature sensor, a temperature monitor and a transmission impedance controller. The transmission impedance controller adjusts impedance of a transmission driver by adjusting an impedance control code in response to the operating temperature of each of the SSDs exceeding at least one threshold value, and the transmission driver reduces impedance based on the adjusted impedance to increase an eye height of the signal SIG transmitted to the base board 630. Therefore, when the operating temperature of the SSDs installed in each of the first SSD backplane 640, the second SSD backplane 650, and the third SSD backplane 660 may vary, the transmission impedance controller may individually adjust an impedance of the transmission driver and thus, may increase (or maintain) reliability of link established between each of the SSDs and the base board 630.

Figure 22:
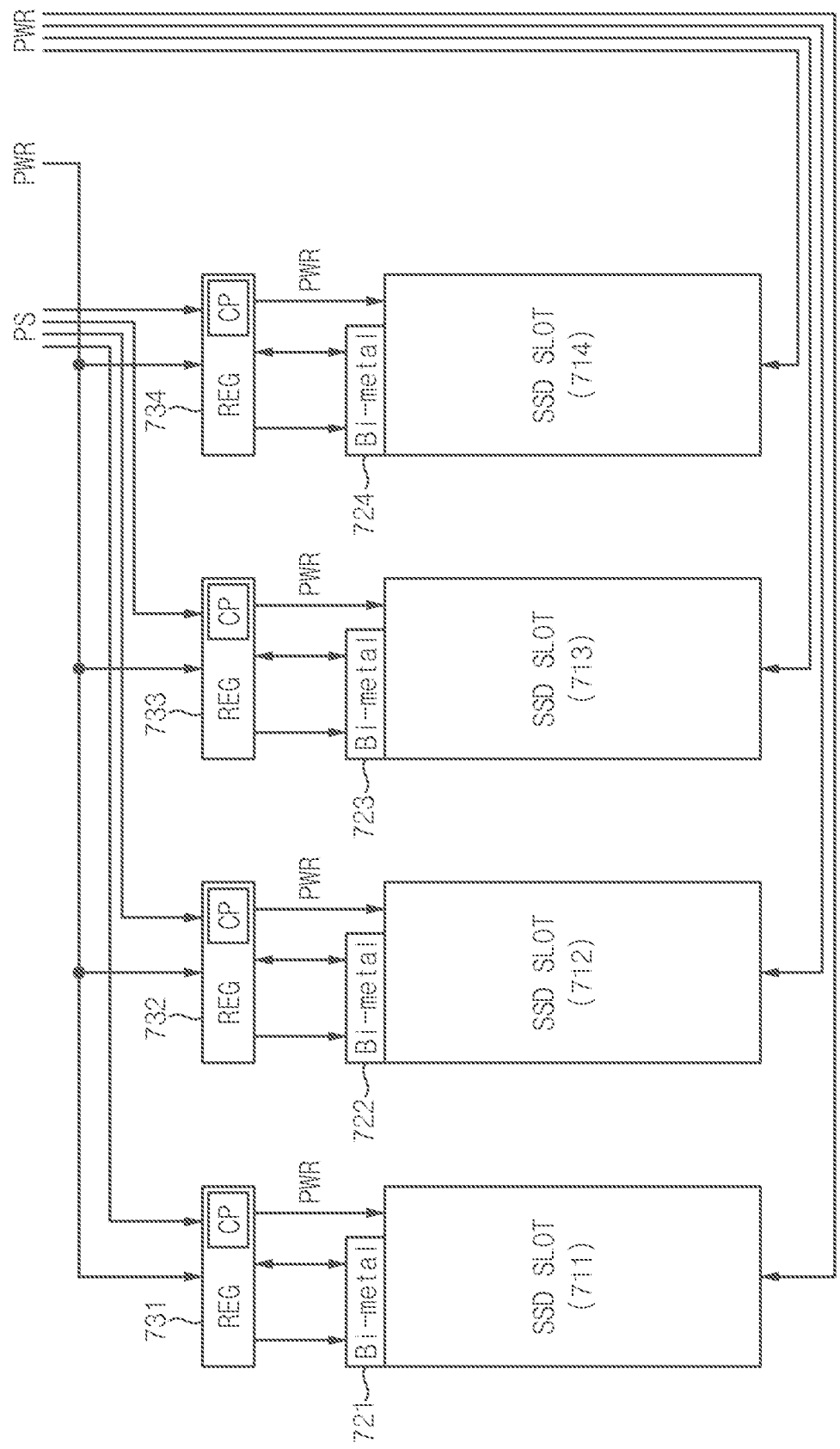
FIG. 22 illustrates an example of an SSD backplane according to example embodiments.

FIG. 22 illustrates an example of an SSD backplane according to example embodiments.

An SSD backplane 700 may correspond to the first SSD backplane 640, the second SSD backplane 650, and the third SSD backplane 660 in FIG. 21.

Referring to FIGS. 20 and 22, the SSD backplane 700 may include first through fourth SSD slots 711, 712, 713, and 714. However, the number of slots is not limited. A respective SSD may be installed in each of the first SSD slot 711, the second SSD slot 712, the third SSD slot 713, and the fourth SSD slot 714. The SSDs may exchange the signals SIG with the baseboard 630 through signal lines.

The SSD backplane 700 may include first through fourth bi-metals 721, 722, 723, and 724 respectively corresponding to the first through fourth SSD slots 711, 712, 713, and 714, and may include first through fourth regulators (REG)s 731, 732, 733, and 734 respectively corresponding to the first through fourth SSD slots 711, 712, 713, and 714. Each of the first bi-metal 721, the second bi-metal 722, the third bi-metal 723, and the fourth bi-metal 724 may include two separate materials (or metals) joined together and having different thermal expansion coefficients.

In response to an increase of temperature, a material having a greater thermal expansion coefficient may expand more than a material having a smaller thermal expansion coefficient. Accordingly, each of the first bi-metal 721, the second bi-metal 722, the third bi-metal 723, and the fourth bi-metal 724 may be bent toward a material having a smaller thermal expansion coefficient upon heating. Conversely, in response to a decrease of temperature, a material having a greater thermal expansion coefficient may contract more than a material having a smaller thermal expansion coefficient. Accordingly, each of the first bi-metal 721, the second bi-metal 722, the third bi-metal 723, and the fourth bi-metal 724 may be bent toward a material having a greater thermal expansion coefficient upon cooling.

Each of the first bi-metal 721, the second bi-metal 722, the third bi-metal 723, and the fourth bi-metal 724 may be respectively disposed adjacent to the first SSD slot 711, the second SSD slot 712, the third SSD slot 713, and the fourth SSD slot 714, such that the first bi-metal 721, the second bi-metal 722, the third bi-metal 723, and the fourth bi-metal 724 may be bent in response to temperatures of the first SSD slot 711, the second SSD slot 712, the third SSD slot 713, and the fourth SSD slot 714.

The first bi-metal 721, the second bi-metal 722, the third bi-metal 723, and the fourth bi-metal 724 may respectively receive voltages from the first regulator 731, the second regulator 732, the third regulator 733, and the fourth regulator 734. In response to an increase of temperature, the first bi-metal 721, the second bi-metal 722, the third bi-metal 723, and the fourth bi-metal 724 may be bent so as to be connected to (or spaced or disconnected from (e.g., the contacts may be normally open or normally closed, and appropriate logic may be implemented in accordance therewith)) terminals of the first regulator 731, the second regulator 732, the third regulator 733, and the fourth regulator 734. Accordingly, the first bi-metal 721, the second bi-metal 722, the third bi-metal 723, and the fourth bi-metal 724 may return (or may not return) the voltages received from the first regulator 731, the second regulator 732, the third regulator 733, and the fourth regulator 734 to the first regulator 731, the second regulator 732, the third regulator 733, and the fourth regulator 734.

Conversely, in response to a decrease of temperature, the first bi-metal 721, the second bi-metal 722, the third bi-metal 723, and the fourth bi-metal 724 may be bent so as to be spaced from (or attached to) the terminals of the first regulator 731, the second regulator 732, the third regulator 733, and the fourth regulator 734. Accordingly, the first bi-metal 721, the second bi-metal 722, the third bi-metal 723, and the fourth bi-metal 724 may not return (or may return) the voltages received from the first regulator 731, the second regulator 732, the third regulator 733, and the fourth regulator 734 to the first regulator 731, the second regulator 732, the third regulator 733, and the fourth regulator 734.

The SSD backplane 700 may be powered on or powered off in response to the power signals PS from the baseboard 630. When the SSD backplane 700 is powered on, the first regulator 731, the second regulator 732, the third regulator 733, and the fourth regulator 734 may supply a power to the SSDs of the first SSD slot 711, the second SSD slot 712, the third SSD slot 713, and the fourth SSD slot 714. When the SSD backplane 700 is powered off, the first regulator 731, the second regulator 732, the third regulator 733, and the fourth regulator 734 may block the power from being supplied to the SSDs of the first SSD slot 711, the second SSD slot 712, the third SSD slot 713, and the fourth SSD slot 714.

When the SSD backplane 700 is powered off, the first regulator 731, the second regulator 732, the third regulator 733, and the fourth regulator 734 may monitor whether voltages are transferred from the first bi-metal 721, the second bi-metal 722, the third bi-metal 723, and the fourth bi-metal 724. When the voltages are not transferred (or are transferred), the first regulator 731, the second regulator 732, the third regulator 733, and the fourth regulator 734 may maintain power interruption. When the voltages are transferred (or are not transferred), the first regulator 731, the second regulator 732, the third regulator 733, and the fourth regulator 734 may supply the power to the SSDs of the first SSD slot 711, the second SSD slot 712, the third SSD slot 713, and the fourth SSD slot 714.

Each of the first regulator 731, the second regulator 732, the third regulator 733, and the fourth regulator 734 may include a capacitor CP that stores power. When an ambient temperature is sufficiently high that a voltage is transferred from one of the first bi-metal 721, the second bi-metal 722, the third bi-metal 723, and the fourth bi-metal 724 (or that a voltage is not transferred therefrom), the corresponding regulator may supply a power to the corresponding SSD. In the case where a voltage is not transferred (or is transferred) from one bi-metal as an ambient temperature decreases before the retention recovery operation of the corresponding SSD is completed, the corresponding regulator may block power from being supplied to the corresponding SSD. In this case, the corresponding SSD may complete the retention recovery operation by using a power stored in the capacitor CP. For example, the capacitor CP may be connected with an output terminal of the corresponding regulator, from which the power PWR is output.

Figure 23:
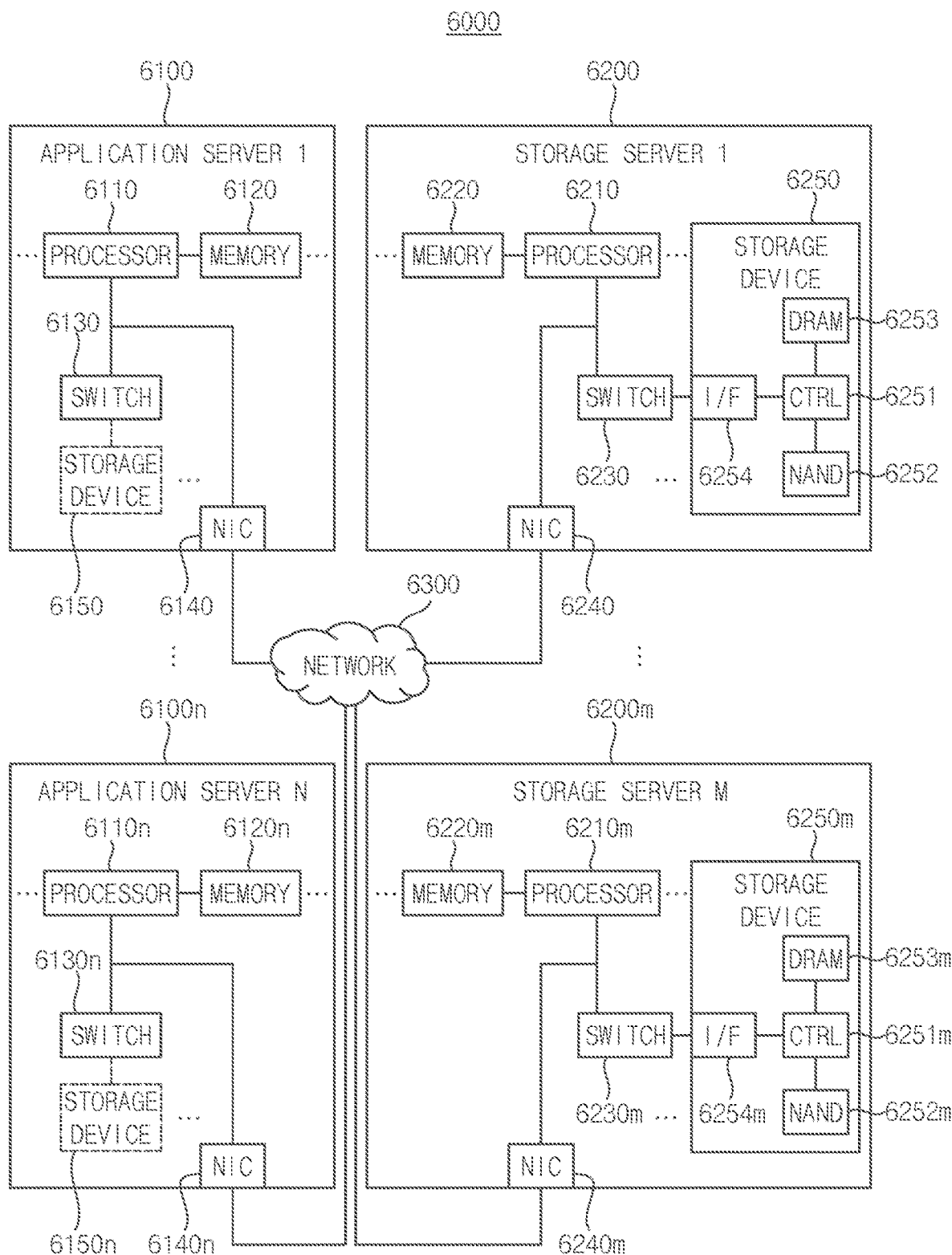
FIG. 23 is a block diagram illustrating a data center including a storage device according to example embodiments.

FIG. 23 is a block diagram illustrating a data center including a storage device according to example embodiments.

Referring to FIG. 23, a data center 6000 may be a facility that collects various types of data and provides various services, and may be referred to as a data storage center. The data center 6000 may be a system for operating search engines and databases, and may be a computing system used by companies such as banks or government agencies. The data center 6000 may include application servers 6100 to 6100n and storage servers 6200 to 6200m. The number of the application servers 6100 to 6100n and the number of the storage servers 6200 to 6200m may be variously selected according to example embodiments, and the number of the application servers 6100 to 6100*n* and the number of the storage servers 6200 to 6200*m* may be different from each other.

The application server 6100 may include at least one processor 6110 and at least one memory 6120, and the storage server 6200 may include at least one processor 6210 and at least one memory 6220. An operation of the storage server 6200 will be described as an example. The processor 6210 may control overall operations of the storage server 6200, and may access the memory 6220 to execute instructions and/or data loaded in the memory 6220. The memory 6220 may include at least one of a double data rate (DDR) synchronous dynamic random access memory (SDRAM), a high bandwidth memory (HBM), a hybrid memory cube (HMC), a dual in-line memory module (DIMM), an Optane DIMM, a nonvolatile DIMM (NVDIMM), etc. The number of the processors 6210 and the number of the memories 6220 included in the storage server 6200 may be variously selected according to example embodiments. In some example embodiments, the processor 6210 and the memory 6220 may provide a processor-memory pair. In some example embodiments, the number of the processors 6210 and the number of the memories 6220 may be different from each other. The processor 6210 may include a single core processor or a multiple core processor. The above description of the storage server 6200 may be similarly applied to the application server 6100. The application server 6100 may include at least one storage device 6150, and the storage server 6200 may include at least one storage device 6250. In some example embodiments, the application server 6100 may not include the storage device 6150. The number of the storage devices 6250 included in the storage server 6200 may be variously selected according to example embodiments.

The application servers 6100 to 6100*n* and the storage servers 6200 to 6200*m* may communicate with each other through a network 6300. The network 6300 may be implemented using a fiber channel (FC) or an Ethernet. The FC may be a medium used for a relatively high speed data transmission, and an optical switch that provides high performance and/or high availability may be used. The storage servers 6200 to 6200*m* may be provided as file storages, block storages or object storages according to an access scheme of the network 6300.

In some example embodiments, the network 6300 may be a storage-only network or a network dedicated to a storage such as a storage area network (SAN). For example, the SAN may be an FC-SAN that uses an FC network and is implemented according to an FC protocol (FCP). For another example, the SAN may be an IP-SAN that uses a transmission control protocol/internet protocol (TCP/IP) network and is implemented according to an iSCSI (a SCSI over TCP/IP or an Internet SCSI) protocol. In other example embodiments, the network 6300 may be a general or normal network such as the TCP/IP network. For example, the network 6300 may be implemented according to at least one of protocols such as an FC over Ethernet (FCoE), a network attached storage (NAS), a nonvolatile memory express (NVMe) over Fabrics (NVMe-oF), etc.

Hereinafter, example embodiments will be described based on the application server 6100 and the storage server 6200. The description of the application server 6100 may be applied to the other application server 6100*n* (including switch 6130*n*, and NIC 6140*n*), and the description of the storage server 6200 may be applied to the other storage server 6200*m* (including switch 6230*m*, memory 6220*m*, processor 6210*m*, storage device 6250*m*, NIC 6240*m*, DRAM 6253*m*, CTRL 6251*m*, I/F 6254*m*, and NAND 6252*m*).

The application server 6100 may store data requested to be stored by a user or a client into one of the storage servers 6200 to 6200*m* through the network 6300. In addition, the application server 6100 may obtain data requested to be read by the user or the client from one of the storage servers 6200 to 6200*m* through the network 6300. For example, the application server 6100 may be implemented as a web server or a database management system (DBMS).

The application server 6100 may access a memory 6120*n* or a storage device 6150*n* included in the other application server 6100*n* through the network 6300, and/or may access the memories 6220 to 6220*m* or the storage devices 6250 to 6250*m* included in the storage servers 6200 to 6200*m* through the network 6300. Thus, the application server 6100 may perform various operations on data stored in the application servers 6100 to 6100*n* and/or the storage servers 6200 to 6200*m*. For example, the application server 6100 may execute a command for moving or copying data between the application servers 6100 to 6100*n* and/or the storage servers 6200 to 6200*m*. The data may be transferred from the storage devices 6250 to 6250*m* of the storage servers 6200 to 6200*m* to the memories 6120 to 6120*n* of the application servers 6100 to 6100*n* directly or through the memories 6220 to 6220*m* of the storage servers 6200 to 6200*m*. For example, the data transferred through the network 6300 may be encrypted data for security or privacy.

In the storage server 6200, an interface 6254 may provide a physical connection between the processor 6210 and a controller 6251 and/or a physical connection between a network interface card (NIC) 6240 and the controller 6251. For example, the interface 6254 may be implemented based on a direct attached storage (DAS) scheme in which the storage device 6250 is directly connected with a dedicated cable. For example, the interface 6254 may be implemented based on at least one of various interface schemes such as an advanced technology attachment (ATA), a serial ATA (SATA) an external SATA (e-SATA), a small computer system interface (SCSI), a serial attached SCSI (SAS), a peripheral component interconnection (PCI), a PCI express (PCIe), an NVMe, an IEEE 1394, a universal serial bus (USB), a secure digital (SD) card interface, a multi-media card (MMC) interface, an embedded MMC (eMMC) interface, a universal flash storage (UFS) interface, an embedded UFS (eUFS) interface, a compact flash (CF) card interface, etc.

The storage server 6200 may further include a switch 6230 and the NIC 6240. The switch 6230 may selectively connect the processor 6210 with the storage device 6250 or may selectively connect the NIC 6240 with the storage device 6250 under a control of the processor 6210. Similarly, the application server 6100 may further include a switch 6130 and an NIC 6140.

In some example embodiments, the NIC 6240 may include a network interface card, a network adapter, or the like. The NIC 6240 may be connected to the network 6300 through a wired interface, a wireless interface, a Bluetooth interface, an optical interface, or the like. The NIC 6240 may further include an internal memory, a digital signal processor (DSP), a host bus interface, or the like, and may be connected to the processor 6210 and/or the switch 6230 through the host bus interface. The host bus interface may be implemented as one of the above-described examples of the interface 6254. In some example embodiments, the NIC 6240 may be integrated with at least one of the processor 6210, the switch 6230 and the storage device 6250.

In the storage servers 6200 to 6200m and/or the application servers 6100 to 6100n, the processor may transmit a command to the storage devices 6150 to 6150n and 6250 to 6250m or the memories 6120 to 6120n and 6220 to 6220m to program or read data. For example, the data may be error-corrected data by an error correction code (ECC) engine. For example, the data may be processed by a data bus inversion (DBI) or a data masking (DM), and may include a cyclic redundancy code (CRC) information. For example, the data may be encrypted data for security or privacy.

The storage devices 6150 to 6150m and 6250 to 6250m may transmit a control signal and command/address signals to NAND flash memory devices 6252 to 6252m in response to a read command received from the processor. When data is read from the NAND flash memory devices 6252 to 6252m, a read enable (RE) signal may be input as a data output control signal and may serve to output data to a DQ bus. A data strobe signal (DQS) may be generated using the RE signal. The command and address signals may be latched in a page buffer based on a rising edge or a falling edge of a write enable (WE) signal.

The controller 6251 may control overall operations of the storage device 6250. In some example embodiments, the controller 6251 may include a static random access memory (SRAM). The controller 6251 may write data into the NAND flash memory device 6252 in response to a write command, or may read data from the NAND flash memory device 6252 in response to a read command. For example, the write command and/or the read command may be provided from the processor 6210 in the storage server 6200, the processor 6210m in the other storage server 6200m, or the processors 6110 to 6110n in the application servers 6100 to 6100n. A DRAM 6253 may temporarily store (e.g., may buffer) data to be written to the NAND flash memory device 6252 or data read from the NAND flash memory device 6252. Further, the DRAM 6253 may store meta data. The meta data may be data generated by the controller 6251 to manage user data or the NAND flash memory device 6252.

The storage device 6250 may correspond to a storage device according to example embodiments and may increase an eye height of a transmission signal by reducing an impedance of a transmission driver as an operating (ambient) temperature of the storage device 6250 increases.

The present disclosures may be applied to various electronic devices including a nonvolatile memory device. For example, the present disclosures may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A storage device comprising:
   at least one nonvolatile memory device; and
   a storage controller, comprising a transmission driver, configured to control the at least one nonvolatile memory device based on a request from an external host,
   wherein the storage controller is configured to adaptively adjust an impedance of the transmission driver based on a change of an operating temperature of the storage device,
   wherein the transmission driver is configured to transmit a transmission signal to the external host through a link, and
   wherein the storage controller is further configured to decrease the impedance of the transmission driver in response to an increase of the operating temperature such that an eye height of the transmission signal is increased.

2. The storage device of claim 1, wherein the storage controller is configured to:
   transmit the transmission signal to the external host based on the impedance having a first impedance value, in response to the operating temperature being equal to or smaller than a first threshold value; and
   transmit the transmission signal to the external host based on the impedance having a second impedance value smaller than the first impedance value, in response to the operating temperature exceeding the first threshold value.

3. The storage device of claim 2, wherein the storage controller is configured to transmit the transmission signal to the external host based on the impedance having a third impedance value smaller than the second impedance value, in response to the operating temperature exceeding a second threshold value greater than the first threshold value.

4. The storage device of claim 1, wherein the storage controller comprises:
   a temperature sensor configured to sense the operating temperature of the storage device and generate an temperature signal corresponding to the operating temperature;
   a temperature monitor configured to monitor the operating temperature of the storage device based on the temperature signal and generate an alert signal in response to the operating temperature exceeding at least one threshold value;
   a transmission impedance controller configured to generate an impedance control code for adjusting the impedance based on the alert signal; and
   a host interface circuit comprising the transmission driver configured to adjust the impedance in response to the impedance control code to adjust the eye height of the transmission signal.

5. The storage device of claim 4, wherein the temperature monitor is configured to:
   set a plurality of bits of the alert signal to have a first state in response to the operating temperature being equal to or smaller than a first threshold value of the at least one threshold value;
   set the plurality of bits of the alert signal to have a second state different from the first state in response to the operating temperature exceeding the first threshold value; and
   set the plurality of bits of the alert signal to have a third state different from the second state and the first state in response to the operating temperature exceeding a second threshold value greater than the first threshold value of the at least one threshold value.

6. The storage device of claim 5, wherein the transmission impedance controller is configured to:
generate the impedance control code to have a first impedance value in response to the alert signal having the first state;
generate the impedance control code to have a second impedance value smaller than the first impedance value in response to the alert signal having the second state; and
generate the impedance control code to have a third impedance value smaller than the second impedance value in response to the alert signal having the third state.

7. The storage device of claim 6, wherein the transmission impedance controller is configured to store a table, and
wherein the table is configured to store the first state, the second state and the third state of the alert signal, and values of the impedance control code corresponding to the first state, the second state and the third state.

8. The storage device of claim 6, wherein the transmission impedance controller is configured to store a firmware, and
wherein the firmware is configured to store the first state, the second state and the third state of the alert signal, and values of the impedance control code corresponding to the first state, the second state and the third state.

9. The storage device of claim 6, wherein the first impedance value is determined based on a transmission preset value and a coefficient value optimized for a third phase of equalization process of a peripheral component interconnect express (PCIe) link training between the external host and the storage controller.

10. The storage device of claim 4, wherein the transmission driver comprises a plurality of driver segments connected in parallel between a power supply voltage and a ground voltage,
wherein the plurality of driver segments configured to receive a first sub equalized signal and a second sub equalized signal commonly from a transmission equalizer in the host interface circuit, and
wherein the transmission driver is configured to adjust the impedance by adjusting a number of driver segments, which are enabled, from among the plurality of driver segments, in response to the impedance control code.

11. The storage device of claim 10, wherein the transmission driver is configured to increase the number of driver segments which are enabled based on an increase of the operating temperature.

12. The storage device of claim 10, wherein each of the plurality of driver segments comprises:
a p-channel metal-oxide semiconductor (PMOS) transistor connected between the power supply voltage and a first node and having a first gate to receive a first bit of a pull-up control code of the impedance control code;
a first n-channel metal-oxide semiconductor (NMOS) transistor connected between the first node and a second node and having a second gate to receive the first sub equalized signal;
a second NMOS transistor connected between the first node and a third node in parallel with the first NMOS transistor and having a third gate to receive the second sub equalized signal;
a third NMOS transistor connected between the second node and a fourth node and having a fourth gate to receive the second sub equalized signal;
a fourth NMOS transistor connected between the third node and the fourth node in parallel with the third NMOS transistor and having a fifth gate to receive the first sub equalized signal; and
a fifth NMOS transistor connected between the fourth node and the ground voltage and having a sixth gate to receive a second bit of a pull-down control code of the impedance control code, and
wherein a first component of the transmission signal is provided at the second node and a second component of the transmission signal is provided at the third node.

13. The storage device of claim 1, wherein the storage controller is configured to communicate with the external host based on a peripheral component interconnect express (PCIe).

14. An electronic device comprising:
a power supply configured to supply a first power and a second power;
a first solid state drive (SSD) backplane and a second SSD backplane configured to receive the first power from the power supply, the first SSD backplane comprising a first plurality of SSDs and the second SSD backplane comprising a second plurality of SSDs; and
a baseboard configured to receive the second power from the power supply, to independently power on and power off the first SSD backplane and the second SSD backplane, and to access the first plurality of SSDs of the first SSD backplane, wherein the first SSD backplane is in a power-on state,
wherein each of the first plurality of SSDs and the second plurality of SSDs comprises a temperature sensor configured to sense an operating temperature,
wherein each SSD of the first plurality of SSDs and each SSD of the second plurality of SSDs is configured to individually adjust an impedance of a transmission driver included in the each SSD based on the operating temperature,
wherein the first plurality of SSDs comprise a first SSD, the first SSD comprises a first temperature sensor configured to sense a first operating temperature of the first SSD, the first SSD further comprises a first transmission driver, and the first SSD is configured to adjust a first impedance of the first transmission driver, and
wherein the first transmission driver is configured to transmit a first transmission signal to the baseboard through a first link.

15. The electronic device of claim 14 further comprising a plurality of storage controllers, wherein each SSD of the first plurality of SSDs and each SSD of the second plurality of SSDs comprises:
at least one nonvolatile memory device; and
a storage controller of the plurality of storage controllers, each storage controller comprising a respective transmission driver, configured to control the respective at least one nonvolatile memory device based on a request from the baseboard,
wherein the first SSD comprises a first storage controller of the plurality of storage controllers,
wherein the first storage controller is configured to adaptively adjust the first impedance of the first transmission driver based on a change of the first operating temperature.

16. The electronic device of claim 15, wherein the first storage controller is further configured to decrease the first impedance of the first transmission driver in response to an increase of the first operating temperature such that a first eye height of the first transmission signal is increased.

17. The electronic device of claim 15, wherein the first storage controller comprises:

the first temperature sensor, wherein the first temperature sensor is configured to sense the first operating temperature of the first SSD of the first plurality of SSDs and generate a first temperature signal corresponding to the first operating temperature;
  a first temperature monitor configured to monitor the first operating temperature of the first SSD of the first plurality of SSDs based on the first temperature signal and generate a first alert signal in response to the first operating temperature exceeding at least one threshold value;
  a first transmission impedance controller configured to generate a first impedance control code for adjusting the first impedance based on the first alert signal; and
  a first host interface circuit comprising the first transmission driver, wherein the first transmission driver is configured to adjust the first impedance in response to the first impedance control code to adjust a first eye height of the first transmission signal.

18. The electronic device of claim 14, further comprising a plurality of coolers,
  wherein, in response to an increase of the first operating temperature, the baseboard is configured to increase cooling by the plurality of coolers.

19. A storage device comprising:
  at least one nonvolatile memory device; and
  a storage controller configured to control the at least one nonvolatile memory device based on a request from an external host,
  wherein the storage controller comprises:
  a temperature sensor configured to sense an operating temperature of the storage device and generate an temperature signal corresponding to the operating temperature;
  a temperature monitor configured to monitor the operating temperature of the storage device based on the temperature signal and generate an alert signal in response to the operating temperature exceeding at least one threshold value;
  a transmission impedance controller configured to generate impedance control code for adjusting an impedance based on the alert signal; and
  a transmission driver configured to decrease the impedance of the transmission driver in response to an increase of the operating temperature such that an eye height of a transmission signal is increased, and
  wherein the transmission driver is configured to transmit the transmission signal to the external host through a link.

* * * * *